US009325813B2

(12) United States Patent
Venkatachalam Jayaraman et al.

(10) Patent No.: US 9,325,813 B2
(45) Date of Patent: Apr. 26, 2016

(54) FORMATTING DATA PACKETS FOR COMPRESSION

(71) Applicant: QUALCOMM Incorporated, San Diego, CA (US)

(72) Inventors: Venkata Ramanan Venkatachalam Jayaraman, Del Mar, CA (US); Rohit Kapoor, San Diego, CA (US); Sumanth Govindappa, San Diego, CA (US); Murtuza Taheri Chhatriwala, San Diego, CA (US); Srinivasa Rao Eravelli, San Diego, CA (US); Sivaram Srivenkata Palakodety, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 46 days.

(21) Appl. No.: 14/312,468

(22) Filed: Jun. 23, 2014

(65) Prior Publication Data
US 2015/0063374 A1    Mar. 5, 2015

Related U.S. Application Data

(60) Provisional application No. 61/873,151, filed on Sep. 3, 2013.

(51) Int. Cl.
*H04J 3/18* (2006.01)
*H04L 29/06* (2006.01)
*H04L 29/08* (2006.01)

(52) U.S. Cl.
CPC ............ *H04L 69/04* (2013.01); *H04L 67/2828* (2013.01); *H04L 69/22* (2013.01)

(58) Field of Classification Search
CPC ...... H04L 69/04; H04L 67/2828; H04L 69/22
See application file for complete search history.

(56) References Cited

U.S. PATENT DOCUMENTS

| 4,730,348 A | * | 3/1988 | MacCrisken | ........... H03M 7/42 370/472 |
| 5,870,563 A | * | 2/1999 | Roper | ..................... H04L 29/06 370/351 |

(Continued)

FOREIGN PATENT DOCUMENTS

| WO | WO-01/10037 A1 | 2/2001 |
| WO | WO-03/007481 A1 | 1/2003 |

OTHER PUBLICATIONS

International Search Report and Written Opinion—PCT/US2014/053291—ISA/EPO—Nov. 26, 2014. Report and Written Opinion (9 total pages).

*Primary Examiner* — Clemence Han
(74) *Attorney, Agent, or Firm* — Arent Fox LLP

(57) ABSTRACT

Methods and apparatus are described for formatting a compressed data packet. The methods and apparatus include identifying a first data string within a data packet that was previously stored at a first memory location in a compressor memory, and generating a first pointer that references the first memory location in the compressor memory. Further, these aspects optionally include identifying a second data string within the data packet that was not previously stored in the compressor memory. Additionally, these aspects include creating a compressed data packet by replacing the first data string with the first pointer and copying the second data string, and including an indicator corresponding to a number of pointers in the data packet.

14 Claims, 12 Drawing Sheets

(56) References Cited

U.S. PATENT DOCUMENTS

| | | | | |
|---|---|---|---|---|
| 5,874,908 A * | 2/1999 | Craft | ............ | G06T 9/005 341/87 |
| 6,985,965 B2 * | 1/2006 | Hannu | ............ | H03M 7/30 709/247 |
| 7,155,483 B1 * | 12/2006 | Friend | ............ | H04W 28/06 709/206 |
| 7,243,163 B1 * | 7/2007 | Friend | ............ | G06F 17/30575 707/E17.032 |
| 7,526,607 B1 * | 4/2009 | Singh | ............ | G06F 12/0804 711/118 |
| 7,773,634 B1 * | 8/2010 | Machiraju | ............ | H04L 69/04 370/476 |
| 2003/0006919 A1 * | 1/2003 | Collins | ............ | H03M 7/30 341/87 |
| 2003/0009595 A1 * | 1/2003 | Collins | ............ | H03M 7/30 709/247 |
| 2004/0164883 A1 * | 8/2004 | Horie | ............ | H03M 7/3086 341/51 |
| 2005/0210151 A1 * | 9/2005 | Abdo | ............ | H03M 7/3086 709/247 |
| 2007/0189278 A1 | 8/2007 | Tu et al. | | |
| 2009/0201180 A1 | 8/2009 | Schneider | | |
| 2010/0124239 A1 * | 5/2010 | Hughes | ............ | H04L 69/04 370/477 |
| 2012/0243551 A1 * | 9/2012 | Afek | ............ | H04L 63/1416 370/412 |
| 2013/0039487 A1 | 2/2013 | McGrew | | |
| 2013/0250849 A1 * | 9/2013 | Li | ............ | H04L 67/04 370/328 |
| 2013/0262808 A1 * | 10/2013 | Unno | ............ | H03M 7/702 711/165 |

* cited by examiner

FIG. 4    Transmission Data Packet 104

FORMATTING DATA PACKETS FOR COMPRESSION

CLAIM OF PRIORITY UNDER 35 U.S.C §119

The present application for patent claims priority to U.S. Provisional Application No. 61/873,151 entitled "DATA FORMAT FOR COMPRESSED PACKETS" filed Sep. 3, 2013, assigned to the assignee hereof and hereby expressly incorporated by reference.

BACKGROUND

Aspects of the present disclosure relate generally to telecommunication systems, and more particularly, to an apparatus and method for a telecommunication system for formatting data packets for compression, thereby providing consistent service in a wireless communication system.

Wireless and wire-line communication networks are widely deployed to provide various communication services such as telephony, video, data, messaging, broadcasts, and so on. Such networks, which are usually multiple access networks, support communications for multiple users by sharing the available network resources. One example of such a network is the UMTS Terrestrial Radio Access Network (UT-RAN). The UTRAN is the radio access network (RAN) defined as a part of the Universal Mobile Telecommunications System (UMTS), a third generation (3G) mobile phone technology supported by the 3rd Generation Partnership Project (3GPP). The UMTS, which is the successor to Global System for Mobile Communications (GSM) technologies, currently supports various air interface standards, such as Wideband-Code Division Multiple Access (W-CDMA), Time Division-Code Division Multiple Access (TD-CDMA), and Time Division-Synchronous Code Division Multiple Access (TD-SCDMA). The UMTS also supports enhanced 3G data communications protocols, such as High Speed Packet Access (HSPA), which provides higher data transfer speeds and capacity to associated UMTS networks.

In some multimode devices, packet data traffic between a mobile user equipment (UE) and a corresponding access network may not always be encoded in a format that minimizes the transmission packet size. Moreover, when a UE encodes the packet data to minimize the transmission packet size, sometimes there may be difficulty in the receiving device, or decompressor, identifying compressed and uncompressed portions of the transmitted data packet.

Thus, improvements in transmitting data packets within a wireless communication system are desired.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with an aspect, a method of formatting a compressed data packet is described. The method includes identifying a first data string within a data packet that was previously stored at a first memory location in a compressor memory, and generating a first pointer that references the first memory location in the compressor memory. Further, the method optionally includes identifying a second data string within the data packet that was not previously stored in the compressor memory. Additionally, the method includes creating a compressed data packet by replacing the first data string with the first pointer and copying the second data string, and including an indicator corresponding to a number of pointers in the data packet.

In another aspect, the apparatus are described for formatting a compressed data packet is described. The apparatus includes means for identifying a first data string within a data packet that was previously stored at a first memory location in a compressor memory, and generating a first pointer that references the first memory location in the compressor memory. Further, the apparatus includes means for identifying a second data string within the data packet that was not previously stored in the compressor memory. Additionally, the apparatus includes means for creating a compressed data packet by replacing the first data string with the first pointer and copying the second data string, and including an indicator corresponding to a number of pointers in the data packet.

In another aspect, an apparatus for formatting compressed data packets for wireless communication between a user equipment (UE) and a serving node is described. The apparatus includes a compressor component configured to identify a first data string within a data packet that was previously stored at a first memory location in a compressor memory. Further, the apparatus includes a formatting component configured to generate a first pointer that references the first memory location in the compressor memory. Moreover, the compressor component is further configured to create a compressed data packet by replacing the first data string with the first pointer, and including an indicator corresponding to a number of pointers in the data packet.

In yet another aspect, a non-transitory computer-readable media executable by an apparatus for formatting compressed data packets for wireless communication between a user equipment (UE) and a serving node is described. The computer-readable media includes code for identifying a first data string within a data packet that was previously stored at a first memory location in a compressor memory. Further, the computer-readable media includes code for generating a first pointer that references the first memory location in the compressor memory. Moreover, the computer-readable media includes code for creating a compressed data packet by replacing the first data string with the first pointer, and including an indicator corresponding to a number of pointers in the data packet.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts. In an aspect, the term "component" as used herein may be one of the parts that make up a system, may be hardware or software, and may be divided into other components.

The present aspects generally relate to efficiently formatting data packets for compression. Generally, data packets may be compressed by replacing one or more known or duplicate pieces of data, such as, for example, a particular string of data bytes, or data string, with pointer information. For example, a pointer is a type of data having a value that refers directly to (or "points to") another value stored elsewhere in some sort of memory (or data store). The pointer may include or may reference a particular address that helps identify where in the memory the referenced data is stored. Therefore, less time and space may be required to use a pointer (e.g., an address) in a data packet rather than including the actual data (e.g., entire string of bytes) to which the pointer refers.

However, when a data packet is read, it may not be instantly clear whether the data included therein is an actual value (e.g., data or "literal" data) or pointer information (e.g., a reference to stored data). As such, pointer information may be encoded in such a way that when it is read, the pointer information may not be mistaken for data (e.g., literal bytes) but, rather, is recognized as a pointer. Efficiently performing such encoding may be desirable to further compress data packets and/or reduce the amount of time it takes for uncompressed data packets to be compressed and/or for compressed data packets to be decompressed and read.

Accordingly, in some aspects, the present methods and apparatuses may provide an efficient solution, as compared to current solutions, by formatting compressed data packets to indicate a number of pointers contained in the compressed data packet, and to structure the information provided by a pointer in a certain manner, one or both of which may improve de-compressor efficiency in differentiating between pointer information and literal data and/or improve efficiency and/or reliability in re-generation of the original (uncompressed) data packet. Thus, the present apparatus and methods may generally improve efficiency of a decompressor to correctly decompress a compressed data packet.

Figure 1:
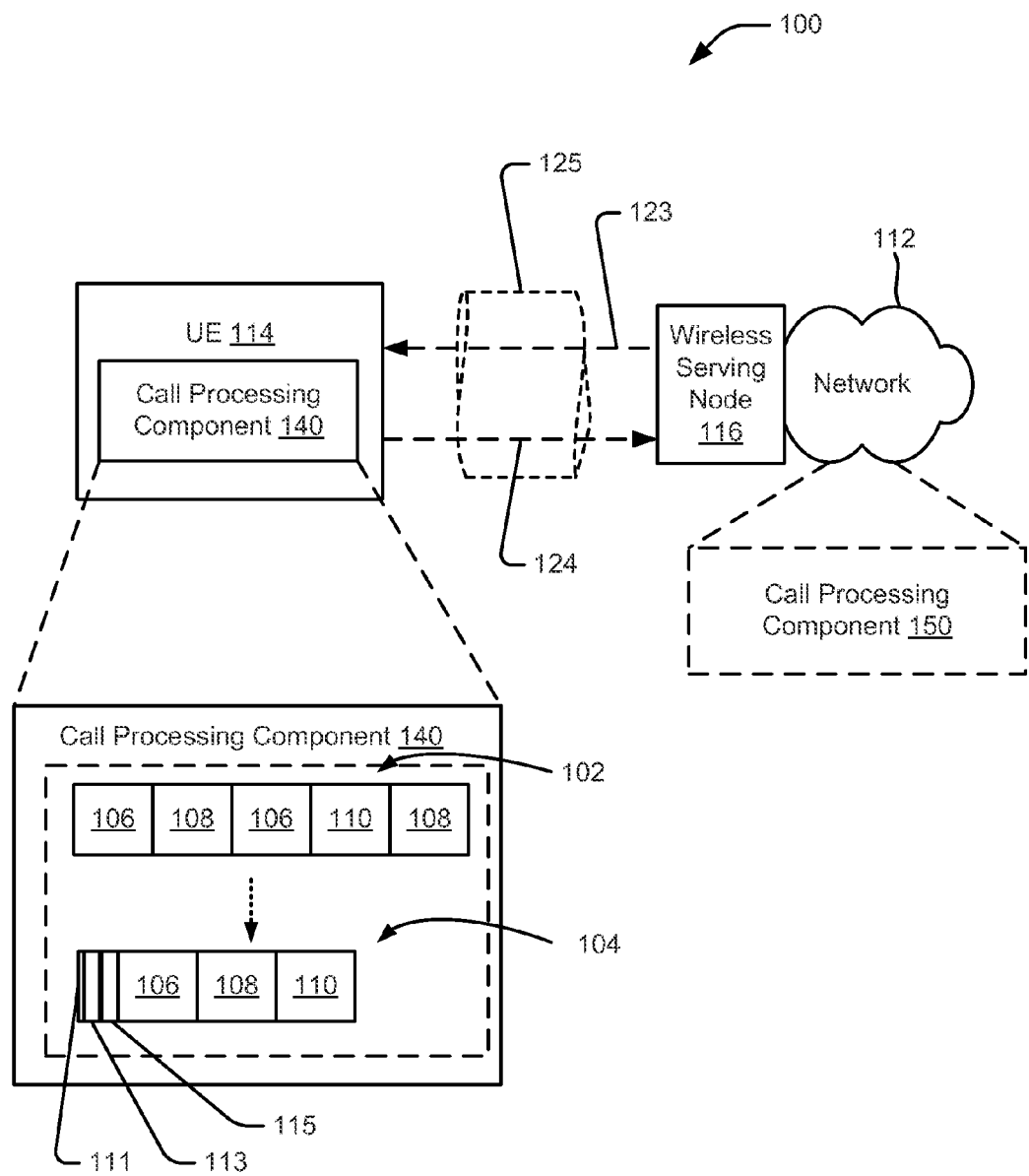
FIG. 1 is a schematic diagram illustrating an example wireless system of aspects of the present disclosure.

Referring to FIG. 1, in one aspect, a wireless communication system 100 is configured to facilitate transmitting a vast amount of data from a mobile device to a network at a fast data transfer rate by using an efficient format for compressed data packets. Wireless communication system 100 includes at least one UE 114 that may communicate wirelessly with one or more network 112 via serving nodes, including, but not limited to, wireless serving node 116 over one or more wireless link 125. The one or more wireless link 125, may include, but are not limited to, signaling radio bearers and/or data radio bearers. Wireless serving node 116 may be configured to transmit one or more signals 123 to UE 114 over the one or more wireless link 125, and/or UE 114 may transmit one or more signals 124 to wireless serving node 116. In an aspect, signal 123 and signal 124 may include, but are not limited to, one or more messages, such as transmitting a data from the UE 114 to network 112 via wireless serving node 116.

In an aspect, UE 114 may include a call processing component 140, which may be configured to transmit data to the wireless serving node 116 over wireless link 125. Specifically, in an aspect, call processing component 140 of UE 114 may be configured for receiving a transmission data packet 102, detecting a duplicate string of bytes in the transmission data packet, and replacing the duplicate string of bytes of the transmission data packet with pointer information according to a format described herein to generate a compressed data packet 104. In other words, call processing component 140 operates to compress the original transmission data packet 102 to reduce its size, and to provide a reliable and efficient format for distinguishing pointer information and literal data in the compressed data packet 104. Subsequently, call processing component 140 operates to transmit compressed data packet 104, such as in signal 124 sent to wireless serving node 116 and/or network 112 via wireless link 125. Similarly, in an alternative or additional aspect, the above noted functionally of call processing component 140 may be included in network 112, as represented by call processing component 150.

In an aspect, for example, call processing component 140 operates to identify duplicate data strings 106 and 108 in transmission data packet 102 and generates compressed data packet 104 that removes the duplicate data and replaces it with corresponding pointer information 113 and 115 as well as an indicator 111 corresponding to the number of pointers in compressed data packet 104. Further, indicator 1 may identify that pointer information 113 and 115 are data references and that data strings 106, 108, and 110 are literal data. For example, in an aspect, call processing component 140 operates to format compressed data packet 104 such that indicator 111 is positioned at the beginning of compressed data packet 104, followed by pointer information 113 and 115, and then followed by the literal, non-repeated data, e.g., data strings 106, 108, and 110 in this case. Moreover, pointer information 113 and 115 may have a particular format and size, and may include a first set of bits corresponding to an arrangement position of the first data string when the compressed data packet is decompressed, a second set of bits corresponding to the first memory location where the first data string was previously stored, and a third set of bits corresponding to a number of bytes to be retrieved from the first memory location, e.g., the bytes corresponding to the duplicate data. As such, a receiving device and/or a de-compressor component receiving compressed data packet 104 may quickly and efficiently parse indicator 111 to identify a location of pointer information 113 and 115 relative to literal data, e.g., data strings 106, 108, and 110 in this case. Thus, receiving device and/or de-compressor component may efficiently determine what pointer information needs to be parsed, and may then efficiently reconstruct the original transmission data packet 102.

In the present aspects, UE 114 may comprise a mobile apparatus and may be referred to as such throughout the present disclosure. Such a mobile apparatus or UE 114 may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology.

Additionally, the one or more wireless nodes, including, but not limited to, wireless serving node 116 of wireless communication system 100, may include one or more of any type of network component, such as an access point, including a base station or node B, a relay, a peer-to-peer device, an authentication, authorization and accounting (AAA) server, a mobile switching center (MSC), a radio network controller (RNC), etc. In a further aspect, the one or more wireless serving nodes of wireless communication system 100 may include one or more small base stations, such as, but not limited to a femtocell, picocell, microcell, or any other base station, access point or cell having a substantially smaller transmit power or coverage area than a macro base station or cell.

Figure 2:
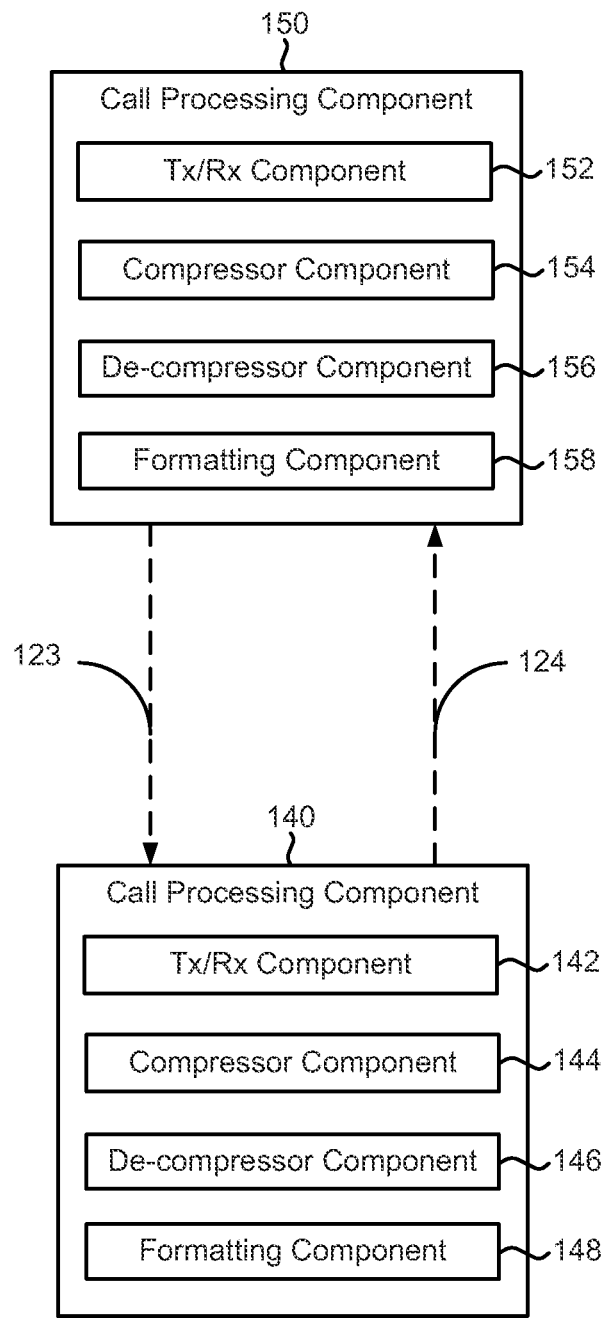
FIG. 2 is a schematic diagram illustrating exemplary aspect of call processing in a wireless communication system.

Referring to FIG. 2, one aspect of call processing component 140 of UE 114, and similarly of call processing component 150 of wireless serving node 116 and/or network 112, may include a number of subcomponents for carrying out the functions described herein.

For example, call processing component 140 may be configured, among other things, to include a TX/RX component 142 configured to transmit and receive transmission data packets. For instance, TX/RX component 142 may be capable of transmitting and/or receiving data to/from network 112 via wireless serving node 116 over link 125.

The call processing component 140 may also be configured to include a compressor component 144 capable of reducing a size of transmission data packet 102, e.g., generating corresponding compressed data packet 104, such as by pattern encoding and entropy encoding. For example, compressor component 144 may be configured for compressing the data transmitted to network 112 via wireless serving node 116 over link 125.

The call processing component 140 may also be configured to include a de-compressor component 146 capable of receiving a compressed data packet and re-forming an original, uncompressed data packet, such as by pattern decoding and entropy decoding. For example, de-compressor component 146 may be configured for de-compressing the data received from network 112 via wireless serving node 116 over link 125.

Additionally, the call processing component 140 may also be configured to include a formatting component 148 operable to configure compressed data packet 104 from transmission data packet 102 such that compressed data packet 104 is structured in a manner to make decoding more efficient and/or reliable. For example, formatting component 148 may be operable to identify a number of pointers, e.g., by counting the number of pointer information such as pointer information 113 and pointer information 115, included within compressed data packet 104 and to configure compressed data packet 104 to include indicator 111 identifying the number of pointers. Further, for example, formatting component 148 may be operable to structure or arrange the information included in pointer information, e.g., pointer information 113 and pointer information 115, to have a particular format and size. For instance, formatting component 148 may arrange pointer information to include a first set of bits corresponding to an arrangement position of the duplicate data string within the data packet when the compressed data packet is decompressed, a second set of bits corresponding to the memory location where the duplicate data string was previously stored, and a third set of bits corresponding to a number of bytes to be retrieved from the memory location, e.g., the bytes corresponding to the duplicate data. Additionally, formatting component 148 may be operable to structure or arrange indicator 111 and pointer information, e.g., pointer information 113 and pointer information 115, within compressed data packet 104 in a manner that may increase efficiency and/or reliability in performing de-compression. For instance, formatting component 148 may be operable to position indicator 111 at the beginning of compressed data packet 104 so that a de-compressor component may quickly identify the number of pointer information that should be parsed. Further, for instance, formatting component 148 may be operable to position the pointer information, e.g., pointer information 113 and pointer information 115, subsequent to indicator 111 so that the pointer information can be efficiently parsed and the literal data within compressed data packet 104 can be quickly and/or reliably identified. Although illustrated as a separate component, it should be noted that formatting component 148 may be included within compressor component 144.

Similarly, in an alternative or additional aspect, the above noted functionally of call processing component 140 may be included in wireless serving node 116 and/or network 112, as represented by call processing component 150. For example, but not limited hereto, call processing component 150 may be hardware mounted within wireless serving node 116 and/or network 112, software or computer readable media and/or firmware stored within a memory or processor of wireless serving node 116 and/or network 112, or any combination thereof.

In an aspect, call processing component 150 may be configured to include TX/RX component 152, a compressor component 154, a de-compressor component 156, and a formatting component 158, respectively having similar capabilities as TX/RX component 142, a compressor component 144, a de-compressor component 146, and a formatting component 148 of call processing component 140 of UE 114.

Thus, the present apparatus and methods include a UE-based, and/or network based, call processing component capable of compressing and decompressing received transmission data packets in order to minimize transmission data packet size, and further capable of formatting compressed data packets to indicate a number of pointers contained in the compressed data packet, and to structure the information provided by a pointer in a certain manner, one or both of which may improve de-compressor efficiency in differentiating between pointer information and literal data and/or improve efficiency and/or reliability in re-generation of the original (uncompressed) data packet.

Figure 3:
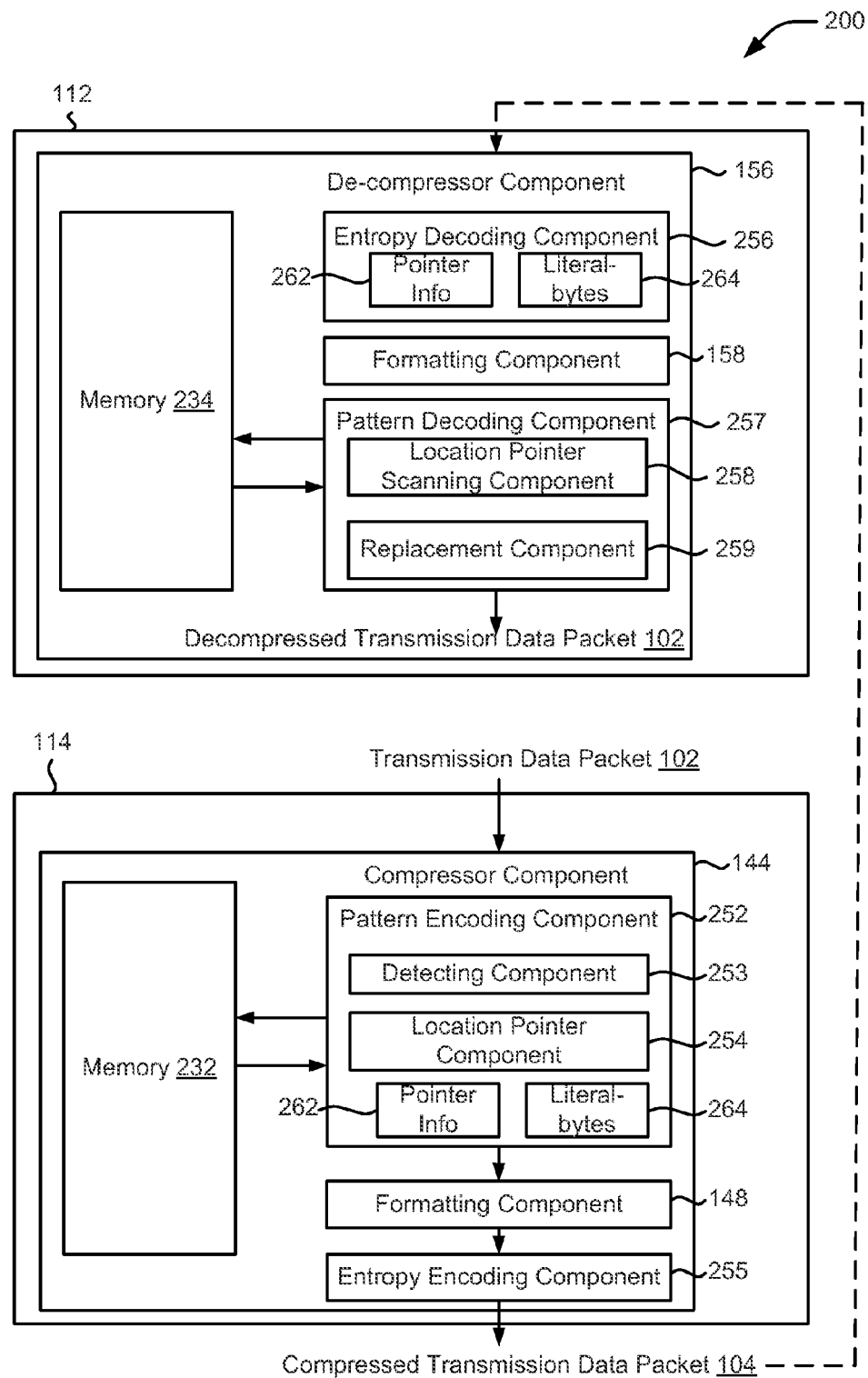
FIG. 3 is a schematic diagram illustrating the functionally and operation of compression and decompression components in a wireless communication system.

FIG. 3 is a schematic diagram 200 further illustrating the functionality and operation of an aspect of the compressor component 144 of UE 114 and the de-compressor component 156 of network 112 and/or wireless serving node 116. It should be noted de-compressor component 146 of UE 114 may operate in a similar manner as de-compressor component 156, and that compressor component 154 of network 112 and/or wireless serving node 116 may operate in a similar manner as compressor component 144. Generally, call processing component 140 may be configured to transmit transmission data packet 102 as a compressed transmission data packet 104 from UE 114 to network 112 after being routed through compressor component 144. Transmission data packet 102 includes or may be carried by signal 124 transmitted from UE 114 to network 112 over wireless link 125, and which may include a header portion and a payload portion having data for transmission.

Once network 112 receives the compressed transmission data packet 104 from UE 114, call processing component 150, is configured to route the compressed transmission data packet 104 through de-compressor component 156, resulting in decompressed transmission data packet, e.g., the original transmission data packet 102. The decompressed transmission data packet 102 may then be utilized by network 112 according to the information located within in the decompressed transmission data packet 102.

It should be noted that the process of compressing and decompressing is represented by the arrows between UE 114 and network 112 of FIG. 3. It should be noted, however, that the direction of transmitting the compressed transmission data packet 104 may be configured to occur from UE 114 to the network 112, as discussed above, and/or from network 112 to UE 114. If the direction of transmitting the compressed transmission data packet 104 occurs from network 112 to UE 114, the components described in FIG. 3 will have corresponding components for compression at network 112, as represented by compressor component 154 (FIG. 2), and decompression at UE 114, as represented by de-compressor 146 (FIG. 2).

In an aspect, compressor component 144 of UE 114 may include a pattern encoding component 252 and an entropy encoding component 255 and a UE-based memory 232. Both the pattern encoding component 252 and the entropy encoding component 255 are capable of encoding transmission data packets sent to the compressor component 144.

The pattern encoding component 252 may also be configured to include a detecting component 253 and a location pointer component 254. The detecting component 253 is capable of detecting a string of bytes in the transmission data packet that matches a string of bytes that have already been saved in UE-based memory 232, e.g., a duplicate data string. In addition, the location pointer component 254 is capable of replacing the string of bytes of the transmission data packet that has been determined to match the string of bytes saved in the UE-based memory 232 with pointer information 262. Pointer information 262 may have a particular format and size, and may include a first set of bits corresponding to an arrangement position of the duplicate data string when the compressed data packet is decompressed, a second set of bits corresponding to a memory location where the duplicate data string was previously stored, and a third set of bits corresponding to a number of bytes to be retrieved from the memory location, e.g., the bytes corresponding to the duplicate data. Further, it should be noted that compressor component 144 may generate more than one set of pointer information 262 when more than one set of duplicate data strings are detected. For instance, pointer information 262 may be the same as location pointer 113 or location pointer 115 discussed above with respect to FIG. 1.

In other words, in an aspect, the goal of pattern encoding component 252 is to detect strings of bytes in the current packet being compressed that match bytes previously processed and stored in the UE-based memory 232. Upon detecting such a match, this particular byte pattern may be replaced by pointer information 262, thereby referencing the location of data in UE-based memory 232 that was determined as a match. Any remaining, e.g., original or non-duplicate, data strings within transmission data packet 102 may be referred to as literal bytes 264. Literal-bytes 264 may be defined as the bytes remaining in the transmission data packet 102 after the location pointer component 254 has replaced some of the bytes in the transmission data packet 102 with pointer information 262. As such, this operation replaces large strings of bytes with fewer ones, so the output from pattern encoding component 252 then only includes either a set of literal-bytes 264 (bytes of the transmission packet not replaced by pointer information 262, e.g., literal bytes such as data strings 106, 108, and 110 as discussed above with respect to FIG. 1) or pointer information 262, e.g., pointer 113 and pointer 115 as discussed above with respect to FIG. 1, referencing where duplicate data in the UE-based memory 232 may be found.

In an aspect, after the transmission data packet 102 is encoded by the pattern encoding component 252, the output from pattern encoding component 252 may be routed to the entropy encoding component 255. The entropy encoding component 255 may be configured to assign entropy coding bit strings to both the set of literal-bytes 264 remaining in the transmission data packet 102 and to the pointer information 262 in order to generate a compressed transmission data packet 104.

In an aspect, entropy encoding component 255 is configured to assign bit strings to both the set of literal-bytes 264 remaining in the transmission data packet 102 after pattern encoding and to pointer information 262 in order to generate a packet with small overall bit length (e.g., a small number of bits). This allows for the literal-bytes 264 and pointer information 262 to be uniquely recovered from the output bit string. Assigning bit strings to the set of literal-bytes 264 and location pointer 262 may be performed by an algorithm, such as Huffman coding and Adaptive Arithmetic Coding. Furthermore, the assignment may be based on pre-configured static mapping between the literal-bytes/pointers and bit strings.

In an aspect, entropy coding may create and assign a unique prefix-code to each unique symbol that occurs in the input. The entropy encoding component 255 may then compress data by replacing each fixed-length input symbol with a corresponding variable-length prefix-free output codeword. For example, entropy encoding component 255 may assign a unique prefix-code to both literal-bytes 264 and pointer information 262 and may replace each fixed code corresponding variable-length prefix-free output codeword to generate compressed data packet 104 with a relatively small overall bit length, e.g., as compared to original transmission data packet 102.

Once the transmission data packet 102 is compressed by the compressor component 144, the resulting compressed transmission data packet 104 may be sent to the de-compressor component 156 of network 112 or wireless serving node 116. In correspondence with compressor component 144, the de-compressor component 156 may be configured to include an entropy decoding component 256 and a pattern decoding component 257. Pattern decoding component 257 may include a location pointer scanning component 258 and a replacement component 259.

In an aspect, for example, when the de-compressor component 156 receives the compressed data packet 104, the entropy decoding component 256 may be configured to decode the entropy coding bit strings in the compressed transmission packet 212 to generate the set of literal-bytes 264 and pointer information 262. As such, the entropy decoding component 256 performs the inverse function of the entropy encoding function.

Further, the set of literal-bytes 264 and the pointer information 262 may be then routed to the pattern decoding component 257, where location pointer scanning component 258 scans the pointer information 262 to determine which preset string of bytes saved in the network-based memory 234 are to be used. In aspect, pattern decoding component 257 operates in conjunction with formatting component 158, which is aware of the configuration applied to compressed data packet 104 by formatting component 148, and thus the number and location of pointer information 262 relative to literal bytes 264 may be quickly and reliably determined. As a result, the replacement component 259 then replaces the pointer information 262 with the preset string of bytes saved in the network-based memory 234 to generate decompressed transmission data packet 214, which may be identical to transmission data packet 102 before compression. In other words, the pattern decoding component 257 scans indicator 111 and pointer information 262 from the output of the entropy decoding component 256 and replaces the pointer information 262 with the preset string of bytes saved in the network-based memory 234 referred to by the pointer information 262.

Both the UE-based memory 232 and the network-based memory 234 include an amount of memory in which the payloads of the most recent packets in the data flow are stored. After a transmission data packet 102 is compressed at the compressor component 144, the uncompressed bits of the transmission data packet are inserted in memory (UE-based memory 232). If there is insufficient space in memory for this operation, then the oldest bits are removed to create space.

After compressed transmission data packet 104 is decompressed at the de-compressor component 156, the bits of the compressed transmission data packet 104 are inserted in memory (network-based memory 234). If there is insufficient space in memory for this operation, the oldest bits are removed to create space. In some aspects, both the UE-based memory 232 and the network-based memory 234 may be emptied for synchronization purposes.

Other aspects of this apparatus and methods include performing compression operation only on a certain part of the transmission data packet. For example, in some aspects, when operating on Transmission Control Protocol/Internet Protocol (TCP/IP) packets, the TCP payload may be compressed using the above method, while the header could be compressed using other techniques such as Robust Header Compression (ROHC).

Still other aspects may be configured to allow both the pattern-coding and entropy coding functions at the compressor component 144/154 and the de-compressor component 156/146 to be transparent, in that the compressor component 144/154 and the de-compressor component 156/146 do not perform any functional operation on the input data. This allows for sending the original packet uncompressed, for example, if the overhead associated with compression is not acceptable. In other words, the functions of the compressor component 144/154 and the de-compressor component 156/146 may be rendered inactive when overhead associated with coding compression/decompression becomes unreadable or unacceptable by UE-based memory 232 or network based memory 234.

Figure 4:
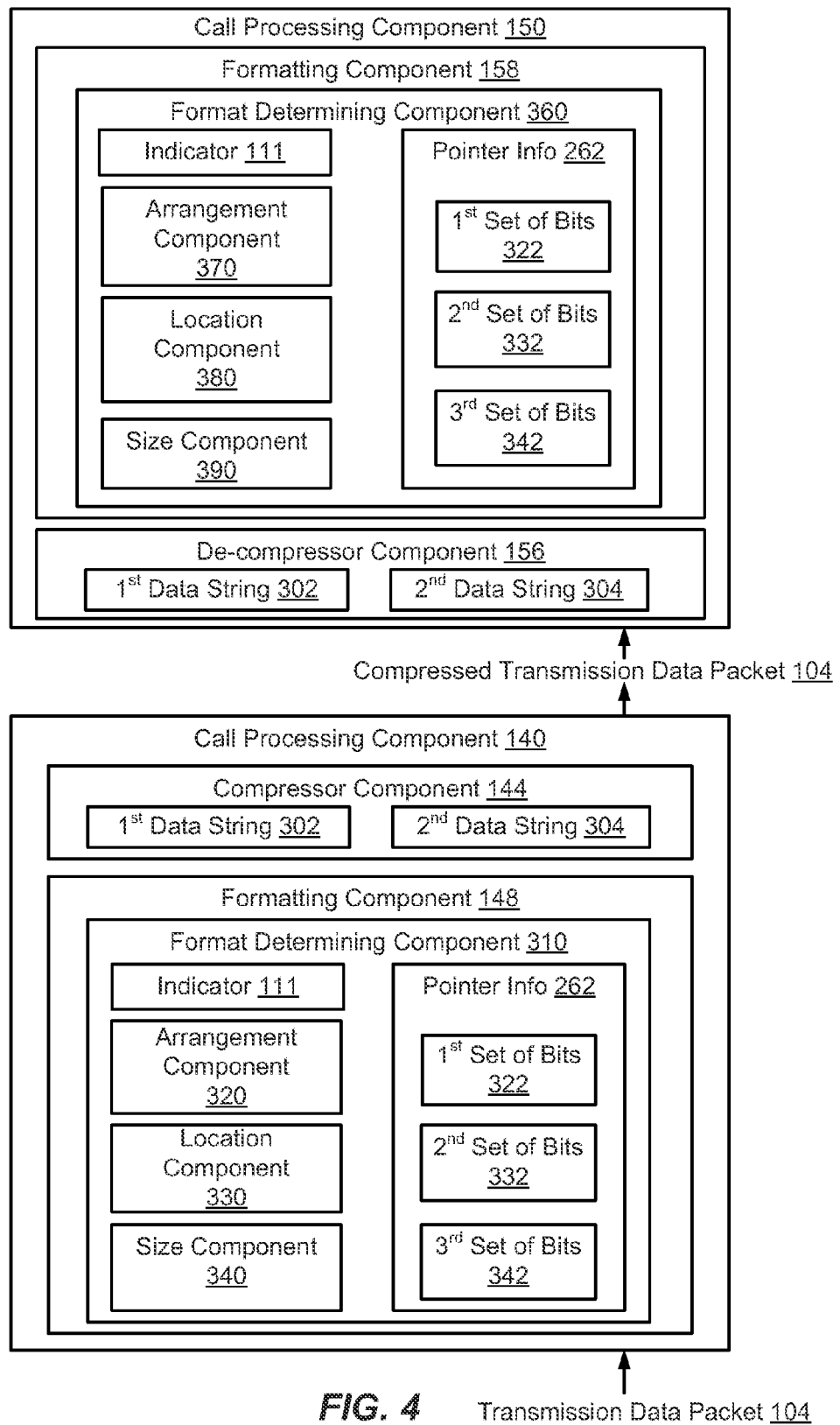
FIG. 4 is a schematic diagram illustrating the functionally and operation of alternative compression and decompression components in a wireless communication system

FIG. 4 is a schematic diagram focusing more particularly on the functionality and operation of the respective formatting component 148 of UE 114 and formatting component 158 of network 112. In this example, call processing component 140 of UE 114 (FIG. 1) may operate to compress a transmission data packet 102 to form compressed transmission data packet 212, which is sent to call processing component 150 of wireless serving node 116 or network 112 (FIG. 1).

Specifically, compressor component 144 may be configured to identify a $1^{st}$ data string 302 within transmission data packet 102 that was previously stored at a $1^{st}$ memory location (e.g., memory 232 in FIG. 3), e.g., a duplicate data string. For example, compressor component 144 may perform the identification via operation of pattern encoding component 252 and/or detecting component 253 discussed above with respect to FIG. 3. Further, compressor component 144 may be configured to generate a $1^{st}$ pointer, e.g., pointer information 262, that references the $1^{st}$ memory location (e.g., in memory 232 in FIG. 3). In turn, compressor component 144 may be configured to identify a $2^{nd}$ data string 304 within transmission data packet 102 that was not previously stored, e.g., an original or non-duplicate data string, or literal bytes 264. Consequently, compressor component 144 may be configured to create compressed transmission data packet 104 by replacing the $1^{st}$ data string 302 with pointer information 262 and including a copy of the $2^{nd}$ data string 304.

Moreover, compressor component 144 may communicate with or operate in conjunction with formatting component 148 to apply an efficient and/or reliable format to compressed transmission data packet 104 in order to prevent decompression errors. Specifically, in an aspect, formatting component 148 may operate to count a number of pointer information 262 within compressed transmission data packet 104 and generate indicator 111 for inclusion in compressed transmission data packet 104. Indicator 111 provides an indication of a count of the number of pointer information 262 within compressed transmission data packet 104. In an aspect, for example, indicator 111 may have a value that represents the number of pointer information 262 minus one. Additionally, formatting component 148 may operate to locate indicator 111 and the one or more pointer information 262 in a particular manner within compressed transmission data packet 104, e.g., relative to literal bytes 264. Further, formatting component 148 may operate to format length and information-related characteristics of indicator 111 and the one or more pointer information 262.

For example, formatting component 148 may operate format determining component 310 to arrange indicator 111 at the beginning of compressed transmission data packet 104, followed by one or more pointer information 262, which may then be followed by the payload data, e.g., literal bytes 264.

Also, for instance, formatting component 148 may operate format determining component 310 establish a length, e.g., a byte length, of indicator 11 and the one or more pointer information 262, e.g., $1^{st}$ pointer in this example. For example, formatting component 148 may operate format determining component 310 to establish that indicator 11 has a 1 byte length, and that $1^{st}$ pointer (e.g., pointer information 262) comprises a four-byte length, in the compressed transmission data packet 104. In an aspect, by establishing a length and position of indicator 111 and the one or more pointer information 262 within compressed transmission data packet 104, a de-compressor may quickly and reliably identify a number and location of the one or more pointer information 262, as well as quickly and reliably identify a location of literal bytes 264 within compressed transmission data packet 104.

Further, with respect to pointer information 262, formatting component 148 may operate format determining component 310 to set other specific formatting of the $1^{st}$ pointer (e.g., pointer information 262). For example, format determining component 310 may be configured to include arrangement component 320 that may be configured to include a $1^{st}$ set of bits 322 within pointer information 262, where $1^{st}$ set of bits 322 indicate an arrangement or position of where the $1^{st}$ data string 302 should be inserted within the data packet when the compressed transmission data packet 104 is decompressed. In an aspect, $1^{st}$ data string 302 may be data from a specific location within transmission data packet 102. As such, $1^{st}$ set of bits 322 of $1^{st}$ pointer (e.g., pointer information 262) may be used during decompression so that $1^{st}$ data string 302 is copied back to its correct location within the data packet. In some aspects, for example, $1^{st}$ set of bits 322 of pointer information 262 may comprise 11 bits, although other lengths of $1^{st}$ set of bits 322 may be utilized. Also, in an aspect, $1^{st}$ set of bits 322 may be positioned or located at the beginning of pointer information 262.

Also, with respect to pointer information 262, format determining component 310 may include location component 330 that may be configured to establish a $2^{nd}$ set of bits 332 to indicate where the $1^{st}$ data string 302 was previously stored, e.g., in the $1^{st}$ memory location of UE memory 232 (FIG. 3). In an aspect, the UE-based memory 232 and the network-based memory 234 (FIG. 3) may be synchronized. As such, $2^{nd}$ set of bits 332 of pointer information 262 may indicate where the $1^{st}$ data string 302 is stored in network-based memory 234. In some aspects, for example, $2^{nd}$ set of bits 332 may comprise 13 bits, although other lengths of $2^{nd}$ set of bits 332 may be utilized. Additionally, in an aspect, $2^{nd}$ set of bits 332 may be positioned or located after $1^{st}$ set of bits 322 within pointer information 262.

Additionally, with respect to pointer information 262, format determining component 310 may be configured to include size component 340 to configure pointer information 262 to identify the number of bytes that should be copied. For example, size component 340 may be configured to establish a $3^{rd}$ set of bits 342 within pointer information 262 that indicate a number of bytes to be retrieved from the $1^{st}$ memory location (e.g., memory 232 in FIG. 3). For instance, the size of the $1^{st}$ data string 302 may vary depending on the amount of data within the data string that matches previously stored data. So, $3^{rd}$ set of bits 342 may identify how many bytes should be retrieved from the memory location identified by $2^{nd}$ set of bits 332, such as during decompression of compressed transmission data packet 104. In a particular aspect, $2^{nd}$ set of bits 332 may point to the location within the $2^{nd}$ memory 234 of de-compressor component 156 (which is synchronized with $1^{st}$ memory 232 of compressor component 144 in FIG. 3) from which to start copying data, and $3^{rd}$ set of bits 342 may establish how much data (starting from the location (or "point") indicated by the $2^{nd}$ set of bits 332) to copy. In some aspects, for example, $3^{rd}$ set of bits 342 may comprise 8 bits, although other lengths of $3^{rd}$ set of bits 342 may be utilized. Additionally, in an aspect, $3^{rd}$ set of bits 342 may be positioned or located after $2^{nd}$ set of bits 332 (which are located after $1^{st}$ set of bits 322) within pointer information 262.

As a result, $1^{st}$ data string 302 may be efficiently and reliably identified by $1^{st}$ set of bits 322, $2^{nd}$ set of bits 332 and $3^{rd}$ set of bits 342.

In some aspects, compressor component 144 may be configured to identify additional data strings within the transmission data packet 102 that were previously stored at additional memory locations with the memory (e.g., memory 232 in FIG. 3). Compressor component 144 may generate one or more additional pointers (e.g., one or more additional pointer information 262 in FIG. 3) for each of the additional data strings that reference a corresponding additional memory location. Compressor component 144 may replace the additional data strings with the additional pointers in the compressed data packet, and increase the count of the number of pointers identified by indicator 111. As such, a compressed transmission data packet 104 may include indicator 111, a plurality of pointer information 262 representing data strings that were replaced, and any number of literal bytes 264 representing data strings that were copied from the transmission data packet 102. As such, indicator 111 and the one or more pointer information 262 may be located, in sequence, at the head of compressed transmission data packet 104, while the copied data strings, e.g., literal-bytes 264 in FIG. 3, are included at the end of the compressed transmission data packet 104.

In another aspect, de-compressor component 156 of FIG. 4, located within call processing component 150 of network 112 or wireless serving node 116, may be configured to receive a compressed transmission data packet (via TX/RX component 152 in FIG. 2), such as compressed data packet 104 formed by one of the operations described above, and decompress the compressed transmission data packet 104 to form a decompressed transmission data packet, e.g., the original transmission data packet 102.

In an aspect, call processing component 150 may also be configured to include formatting component 158, which correspond to and operates in cooperation with formatting component 148. For example, formatting component 158 may include format determining component 360, arrangement component 370, location component 380, and, size component 390. As such, de-compressor component 156 and formatting component 158 and its subcomponents may be configured to operate in an inverse manner, and in an inverse order, as compared to the operation of compressor component 144 and formatting component 148.

For example, in an aspect, formatting component 158 may be configured to include format determining component 360, which may be configured to determine the format that de-compressor component 156 should use when decompressing compressed transmission data packet 104. Specifically, format determining component 360 may be configured to determine that the $1^{st}$ pointer and each additional pointer (e.g., pointer information 262) comprise a four-byte pointer entry in the compressed transmission data packet 104. Further, formatting component 158 may coordinate with de-compressor component 156 in order to decompress the compressed transmission data packet 104 by reading the bits within pointer information 262.

For example, arrangement component 370 may be configured to read the $1^{st}$ set of bits 322 of each pointer information 262 to determine how to arrange the $1^{st}$ data string 302 and the additional data strings (e.g., $2^{nd}$ data string 304) in the decompressed data packet. Location component 380 may be configured to read the $2^{nd}$ set of bits 332 of each pointer information 262 to determine the $1^{st}$ memory location and the additional memory locations (e.g., memory 234 in FIG. 3) for the corresponding data. Size component 390 may be configured to read a $3^{rd}$ set of bits 342 of each pointer information 262 to determine a number of bytes to be retrieved from the $1^{st}$ memory location and the additional memory locations (e.g., memory 234 in FIG. 3). As a result, call processing component 150 may correctly de-compress compressed transmission data packet 104 by coordinating formatting component 158 with de-compressor component 156.

Figure 5:
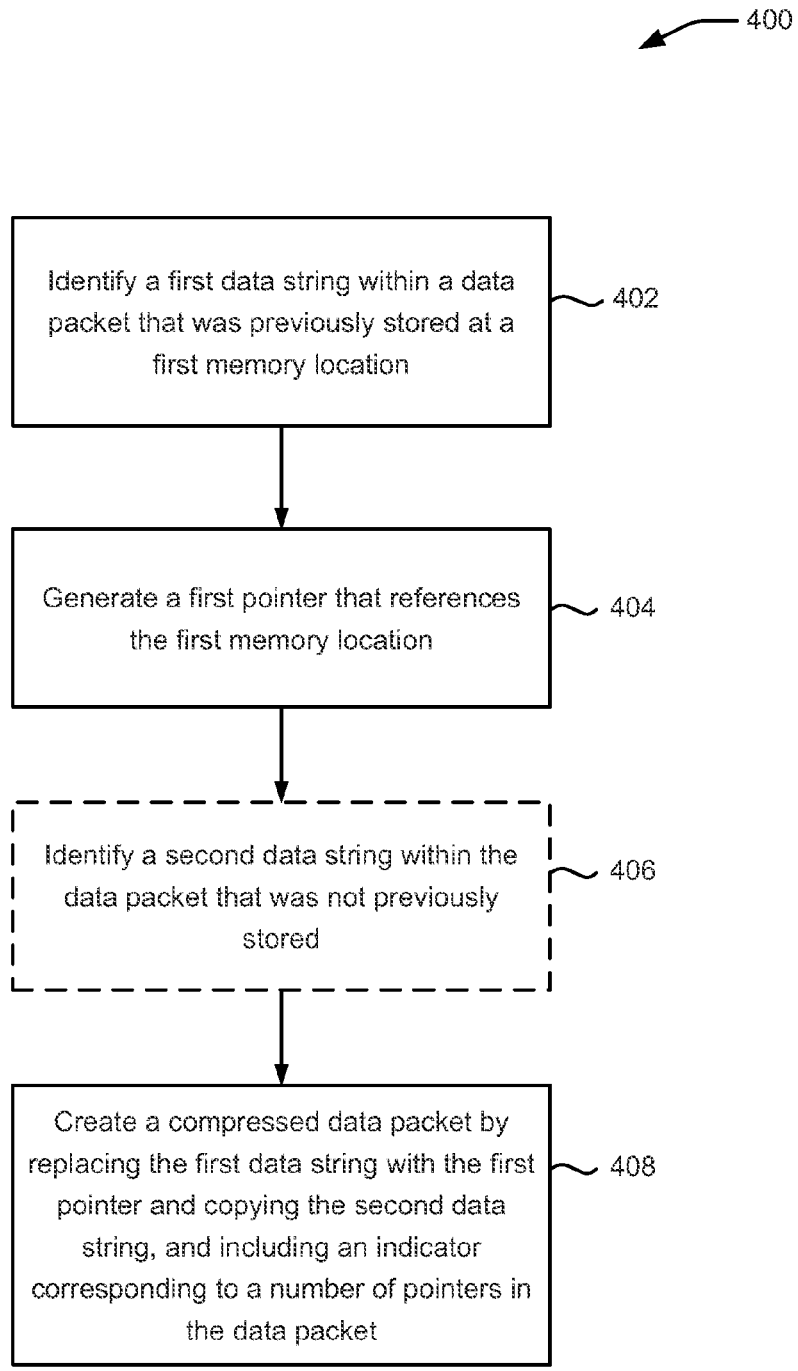
FIG. 5 is a flow diagram illustrating an exemplary method for call processing in a wireless communication system.

Referring to FIG. 5, in operation, a UE such as UE 114 (FIG. 2), or a network such as network 112 (FIG. 2) may perform a method 400 of an aspect for formatting data packets for compression. While, for purposes of simplicity of explanation, the methods herein are shown and described as a series of acts, it is to be understood and appreciated that the methods are not limited by the order of acts, as some acts may, in accordance with one or more aspects, occur in different orders and/or concurrently with other acts from that shown and described herein. For example, it is to be appreciated that the methods could alternatively be represented as a series of interrelated states or events, such as in a state diagram. Moreover, not all illustrated acts may be required to implement a method in accordance with one or more features described herein.

In an aspect, at block 402, method 400 includes identifying a $1^{st}$ data string within a data packet that was previously stored at a $1^{st}$ memory location. For example, as described herein, call processing component 140 may execute compressor component 144 (FIG. 4) to identify a $1^{st}$ data string 302 within a transmission data packet 102 that was previously stored at a $1^{st}$ memory location (e.g., memory 232 in FIG. 3).

At block 404, method 400 includes generating a $1^{st}$ pointer that references the first memory location. For example, as described herein, formatting component 148 may execute compressor component 144 (FIG. 4) to generate a $1^{st}$ pointer (e.g., pointer information 262 in FIG. 3) that references the $1^{st}$ memory location (e.g., memory 232, which is synchronized with memory 234, in FIG. 3). In some instances, the $1^{st}$ pointer may be formatted by formatting component 148 comprising format determining component 310.

Specifically, format determining component 310 may be configured to include arrangement component 320 which may be configured to establish a $1^{st}$ set of bits 322 corresponding to an arrangement configuration of the $1^{st}$ data string 302 when the compressed transmission data packet 212 is decompressed. Further, format determining component 310 may also be configured to include location component 330, which may be configured to establish a $2^{nd}$ set of bits 332 corresponding to the $1^{st}$ memory location (e.g., memory 232 in FIG. 3) where the $1^{st}$ data string 302 was previously stored. Additionally, format determining component 310 may be configured to include size component 340, which may be configured to establish a $3^{rd}$ set of bits 342 corresponding to a number of bytes to be retrieved from the $1^{st}$ memory location (e.g., memory 232 in FIG. 3).

Further at block 406, method 400 optionally includes identifying a $2^{nd}$ data string within the data packet that was not previously stored. For example, as described herein, formatting component 148 may execute compressor component 144 (FIG. 4) to identify a $2^{nd}$ data string 304 within the transmission data packet 102 that was not previously stored.

Additionally, at block 408, method 400 includes creating a compressed data packet by replacing the $1^{st}$ data string with the $1^{st}$ pointer and copying the $2^{nd}$ data string, and including an indicator corresponding to a number of pointers in the data packet. For example, as described herein, call processing component 140 may execute compressor component 144 (FIG. 4) to create a compressed transmission data packet 104 by replacing the $1^{st}$ data string 302 with the $1^{st}$ pointer (e.g., pointer information 262 in FIG. 3) and copying the $2^{nd}$ data string 304. For example, in an aspect, call processing component 140 operates to format compressed data packet 104 such that indicator 111 is positioned at the beginning of compressed data packet 104, followed by pointer information 113 and 115, and then followed by the literal, non-repeated data, e.g., data strings 106, 108, and 110 in this case. Moreover, pointer information 113 and 115 may have a particular format and size, and may include a first set of bits corresponding to an arrangement position of the first data string when the compressed data packet is decompressed, a second set of bits corresponding to the first memory location where the first data string was previously stored, and a third set of bits corresponding to a number of bytes to be retrieved from the first memory location, e.g., the bytes corresponding to the duplicate data. As such, a receiving device and/or a de-compressor component receiving compressed data packet 104 may quickly and efficiently parse indicator 111 to identify a location of pointer information 113 and 115 relative to literal data, e.g., data strings 106, 108, and 110 in this case.

Method 400 may optionally include, subsequent to block 408, transmitting the compressed data packet formatted as described herein.

Figure 6A:
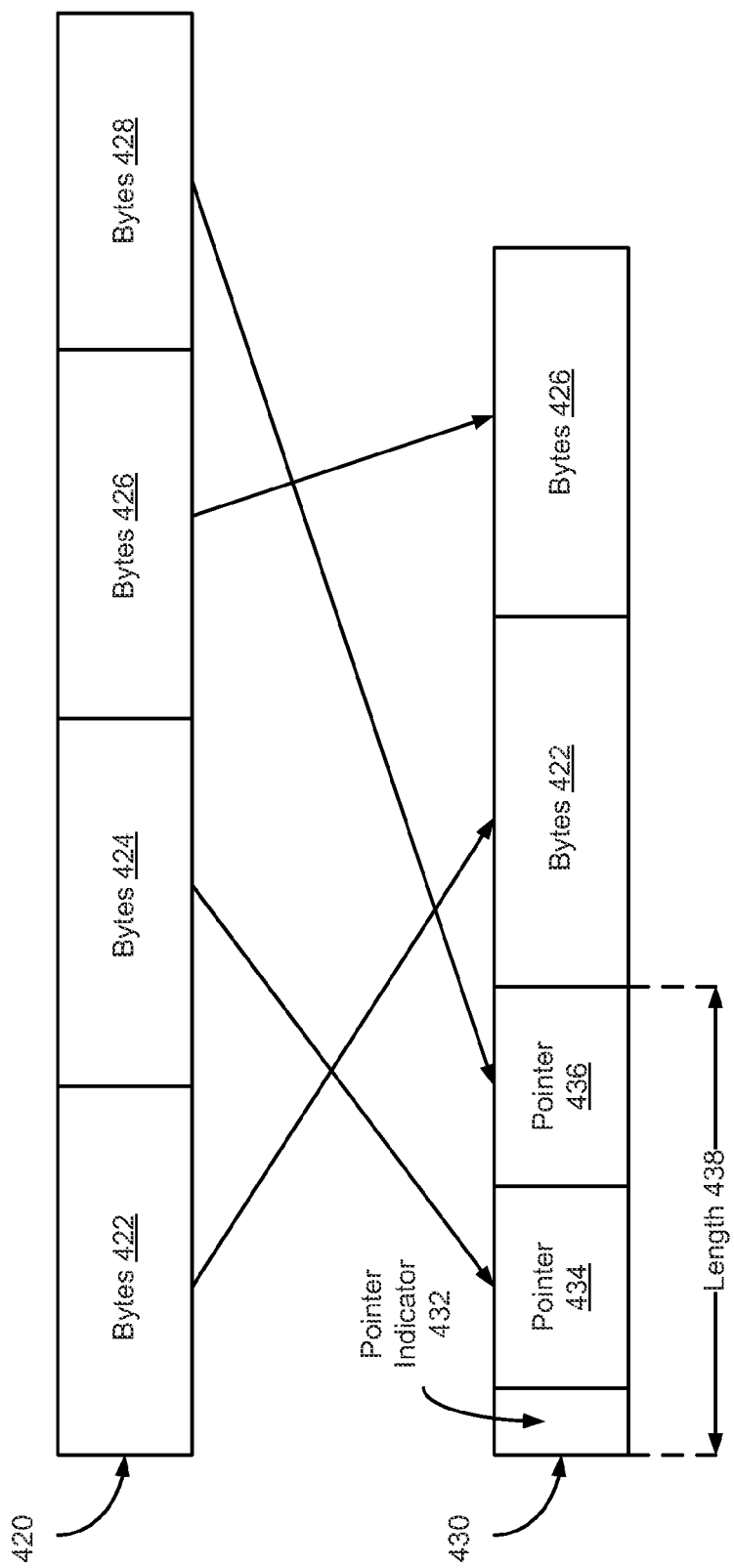
FIGS. 6A and 6B are conceptual diagrams illustrating aspects of the present disclosure.
Figure 6B:
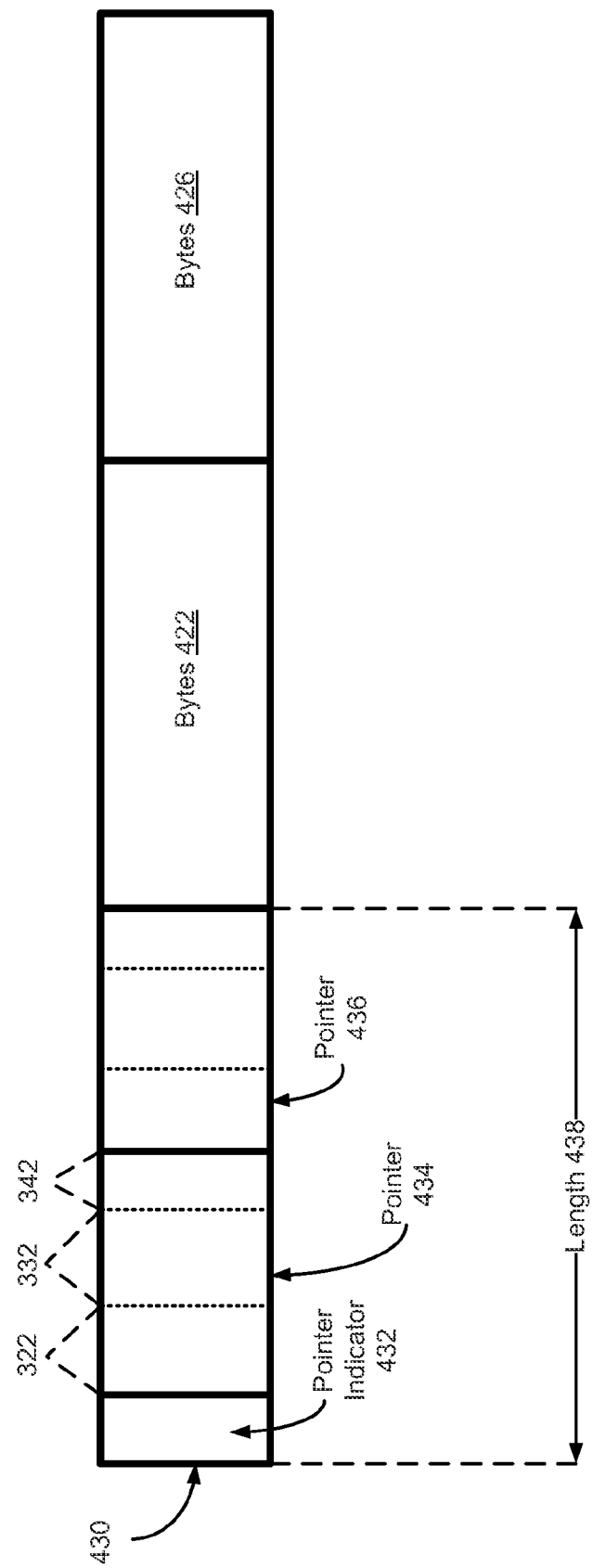

FIGS. 6A and 6B are conceptual diagrams illustrating various aspects of a format of a transmission data packet, such as transmission data packet 102, and a compressed transmission data packet 104.

For example, in FIG. 6A, transmission data packet 420, corresponding to transmission data packet 102, may comprise bytes 422, 424, 426, and 428. In some instances, compressor component 144 (FIG. 3) may be configured to identify that bytes 424 and 428 that match data strings previously stored in a memory (e.g., memory 232 in FIG. 3). Further, compressor component 144 (FIG. 3) may identify bytes 422 and 426 as data strings that were not previously stored in the memory (e.g., memory 262 in FIG. 3). As such, compressor component 144 (FIG. 3) may create a compressed transmission data packet 430, corresponding to compressed transmission data packet 104, based on bytes 422, 424, 426, and 428.

In some instances, compressed transmission data packet 430 may comprise a pointer indicator 432 (corresponding to pointer indicator 111), which, in some instances, may represent the number of pointers included in the compressed transmission data packet 104, or some offset relative thereto, such as the number of pointers minus one. Moreover, pointer indicator 432 may be located at the head of compressed transmission data packet 430. Compressor component 144 may replace bytes 424 and 428 with pointers 434 and 436 pertaining to pointer information (e.g., pointer information 262). Additionally, bytes 422 and 426 may be copied as literal bytes 264 into compressed transmission data packet 430. In some aspects, the compressed portion of the compressed transmission data packet 430 (e.g., pointer indicator 432 and pointers 434 and 436) may have a length 438. For example, length 438 may be five bytes (e.g., one byte in length for pointer indicator 432, two bytes each for pointers 434 and 436).

FIG. 6B illustrates the compressed transmission data packet 430 in further detail. Specifically, pointer indicator 432 may indicate that compressed transmission data packet 430 comprises two pointers. As such, when compressed transmission data packet 430 is de-compressed, de-compressor component 156 (FIG. 3), may identify pointers 434 and 436. Specifically, arrangement component 320 (FIG. 4) may operate to configure $1^{st}$ set of bits 322 within pointer 434, where $1^{st}$ set of bits 322 identify an arrangement or location of the bytes 424 within the data packet in relation with bytes 422 and 426 when the compressed transmission data packet 430 is decompressed. Further, location component 330 may operate to configure $2^{nd}$ set of bits 332 within pointer 434, where $2^{nd}$ set of bits 332 identify the $1^{st}$ memory location (e.g., memory 232 or 234 in FIG. 3) where the bytes 424 were previously stored. Additionally, size component 340 may operate to configure $3^{st}$ set of bits 342 within pointer 434, where $3^{rd}$ set of bits 342 identify the number of bytes to be retrieved from the $1^{st}$ memory location (e.g., memory 232 or 234 in FIG. 3). Similarly, pointer 436 includes similar formatting to identify an arrangement configuration of the bytes 428 in relation with bytes 422 and 426 when the compressed transmission data packet 430 is decompressed.

Figure 7:
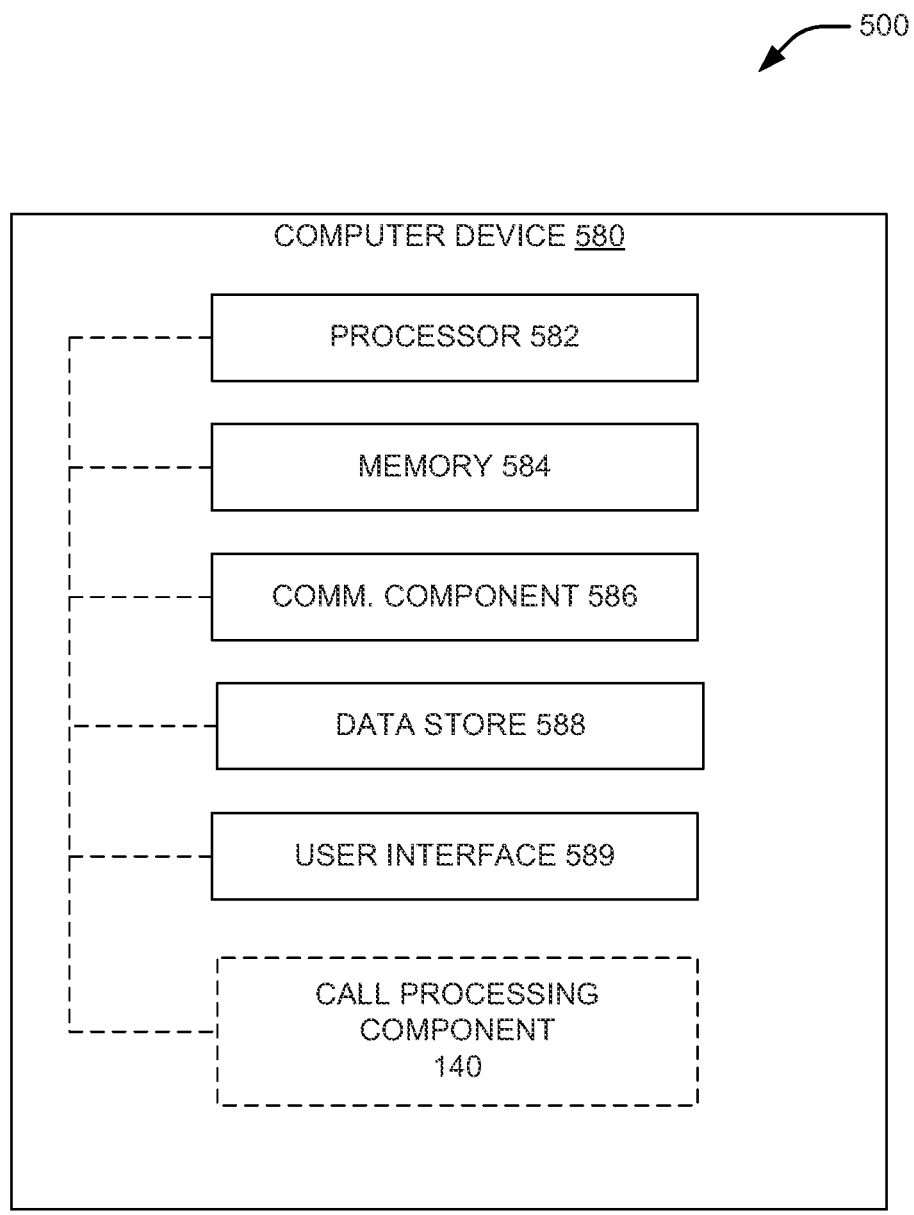
FIG. 7 is a block diagram illustrating additional example components of an aspect of a computer device having a call processing component according to the present disclosure.

Referring to FIG. 7, in one aspect, UE 114 of FIGS. 1 and/or 2 may be represented by a specially programmed or configured computer device 580 operable within wireless communication system 100, wherein the special programming or configuration includes call processing component 140 as described herein. It should be noted that for an implementation in network 112 or wireless serving node 116, specially programmed or configured computer device 580 may replace call processing component 140 with call processing component 150. For example, for implementation as UE 114 (FIG. 2), computer device 580 may include call processing component 140 for compressing transmission data packet 102 according to the formatting described herein, and transmitting compressed data packet 104 from UE 114 to network 112 via wireless serving node 116. Call processing components 140 and 150 may be specially programmed computer readable instructions or code, firmware, hardware, or some combination thereof.

Call processing components 140/150 may be implemented by processor 582 operating in conjunction with memory 584, communication component 586, data store 588, and user interface 589. Computer device 580 includes a processor 582 for carrying out processing functions associated with one or more of components and functions described herein. Processor 582 can include a single or multiple set of processors or multi-core processors. Moreover, processor 582 can be implemented as an integrated processing system and/or a distributed processing system.

Computer device 580 further includes a memory 584, such as for storing data used herein and/or local versions of applications being executed by processor 582. Memory 584 can include any type of memory usable by a computer, such as random access memory (RAM), read only memory (ROM), tapes, magnetic discs, optical discs, volatile memory, non-volatile memory, and any combination thereof.

Further, computer device 580 includes a communications component 586 that provides for establishing and maintaining communications with one or more parties utilizing hardware, software, and services as described herein. Further, Tx/Rx components 152/142 (FIG. 2) may be implemented by communication component 586 for transmitting and/or receiving data to/from network 112 via wireless serving node 116 over link 125. Communications component 586 may carry communications between components on computer device 580, as well as between computer device 580 and external devices, such as devices located across a communications network and/or devices serially or locally connected to computer device 580. For example, communications component 586 may include one or more buses, and may further include transmit chain components and receive chain components associated with a transmitter and receiver, respectively, or a transceiver, operable for interfacing with external devices. For example, in an aspect, a receiver of communications component 586 operates to receive one or more data via a wireless serving node 116, which may be a part of memory 584.

Additionally, computer device 580 may further include a data store 588, which can be any suitable combination of hardware and/or software, that provides for mass storage of information, databases, and programs employed in connection with aspects described herein. For example, data store 588 may be a data repository for applications not currently being executed by processor 582.

Computer device 580 may additionally include a user interface component 589 operable to receive inputs from a user of computer device 580, and further operable to generate outputs for presentation to the user. User interface component 589 may include one or more input devices, including but not limited to a keyboard, a number pad, a mouse, a touch-sensitive display, a navigation key, a function key, a microphone, a voice recognition component, any other mechanism capable of receiving an input from a user, or any combination thereof. Further, user interface component 589 may include one or more output devices, including but not limited to a display, a speaker, a haptic feedback mechanism, a printer, any other mechanism capable of presenting an output to a user, or any combination thereof.

Furthermore, in an aspect, instead of including call processing component 140/150, computer device 580 may be in communication with call processing component 140/150, which may be configured to perform the functions described herein.

Figure 8:
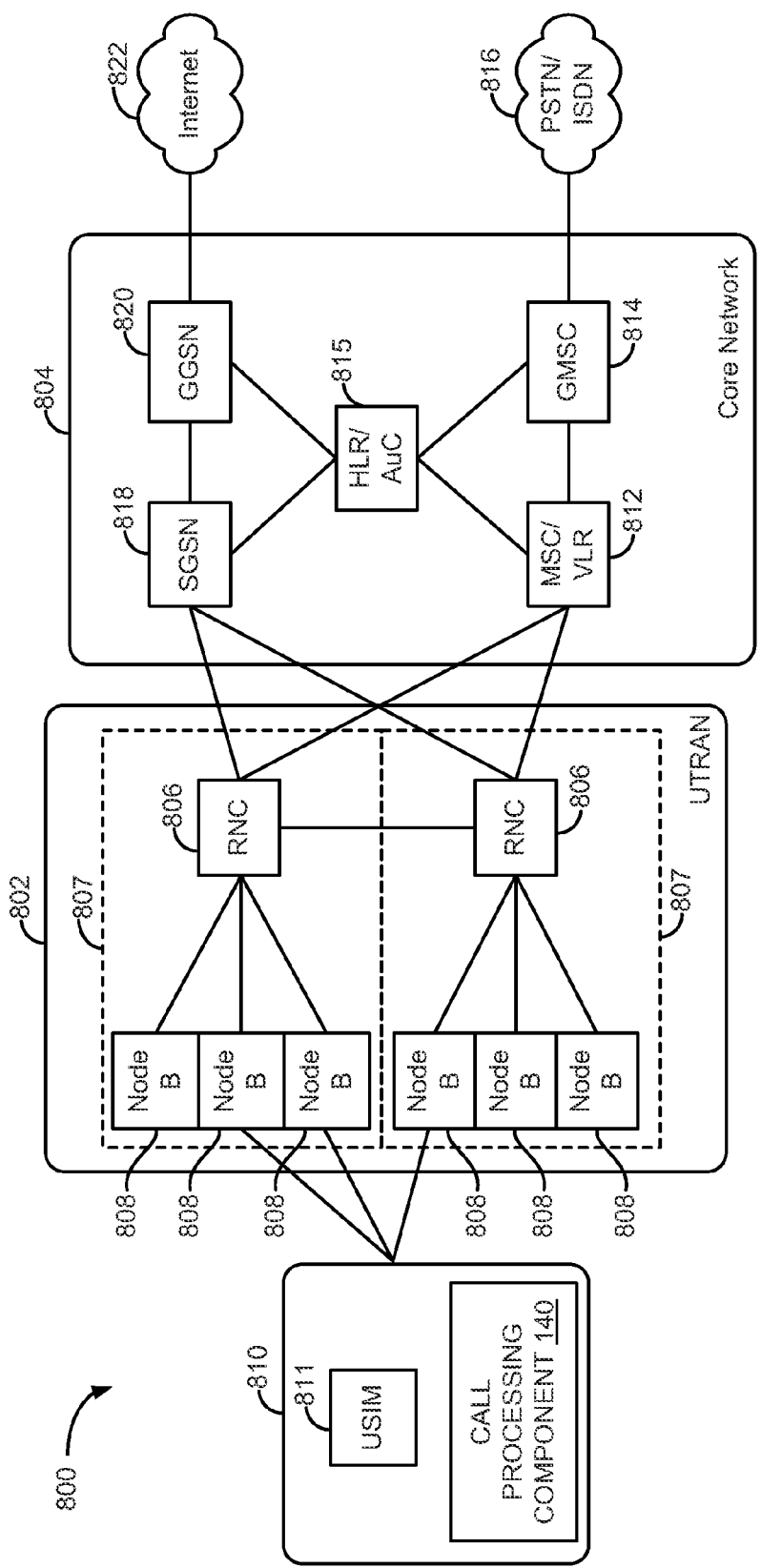
FIG. 8 is a block diagram conceptually illustrating an example of a telecommunications system including a UE configured to perform the functions described herein.

Referring to FIG. 8, by way of example and without limitation, the aspects of the present disclosure are presented with reference to a UMTS system 800 employing a W-CDMA air interface. A UMTS network includes three interacting domains: a Core Network (CN) 804, a UMTS Terrestrial Radio Access Network (UTRAN) 802, and User Equipment (UE) 810. UE 810 may be configured to include, for example, the call processing component 140/150 (FIG. 2) implementing the components described above, such as, but not limited to Tx/Rx component 142/152, compressor component 144/154, and de-compressor component 146/156, as described above. In this example, the UTRAN 802 provides various wireless services including telephony, video, data, messaging, broadcasts, and/or other services. The UTRAN 802 may include a plurality of Radio Network Subsystems (RNSs) such as an RNS 807, each controlled by a respective Radio Network Controller (RNC) such as an RNC 806. Here, the UTRAN 802 may include any number of RNCs 806 and RNSs 807 in addition to the RNCs 806 and RNSs 807 illustrated herein. The RNC 806 is an apparatus responsible for, among other things, assigning, reconfiguring and releasing radio resources within the RNS 807. The RNC 806 may be interconnected to other RNCs (not shown) in the UTRAN 802 through various types of interfaces such as a direct physical connection, a virtual network, or the like, using any suitable transport network.

Communication between a UE 810 and a Node B 808 may be considered as including a physical (PHY) layer and a medium access control (MAC) layer. Further, communication between a UE 810 and an RNC 806 by way of a respective Node B 808 may be considered as including a radio resource control (RRC) layer. In the instant specification, the PHY layer may be considered layer 1; the MAC layer may be considered layer 2; and the RRC layer may be considered layer 3.

The geographic region covered by the RNS 807 may be divided into a number of cells, with a radio transceiver apparatus serving each cell. A radio transceiver apparatus is commonly referred to as a Node B in UMTS applications, but may also be referred to by those skilled in the art as a base station (BS), a base transceiver station (BTS), a radio base station, a radio transceiver, a transceiver function, a basic service set (BSS), an extended service set (ESS), an access point (AP), or some other suitable terminology. For clarity, three Node Bs 808 are shown in each RNS 807; however, the RNSs 807 may include any number of wireless Node Bs. The Node Bs 808 provide wireless access points to a CN 804 for any number of mobile apparatuses. Examples of a mobile apparatus include a cellular phone, a smart phone, a session initiation protocol (SIP) phone, a laptop, a notebook, a netbook, a smartbook, a personal digital assistant (PDA), a satellite radio, a global positioning system (GPS) device, a multimedia device, a video device, a digital audio player (e.g., MP3 player), a camera, a game console, a tablet, a wearable computing device (e.g., a smartwatch, a health or fitness tracker, etc.), an appliance, a sensor, a vending machine, or any other similar functioning device. The UE 810 is commonly referred to as a UE in UMTS applications, but may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology. In a UMTS system, the UE 810 may further include a universal subscriber identity module (USIM) 811, which contains a user's subscription information to a network. For illustrative purposes, one UE 810 is shown in communication with a number of the Node Bs 808. The DL, also called the forward link, refers to the communication link from a Node B 808 to a UE 810, and the UL, also called the reverse link, refers to the communication link from a UE 810 to a Node B 808.

The CN 804 interfaces with one or more access networks, such as the UTRAN 802. As shown, the CN 804 is a GSM core network. However, as those skilled in the art will recognize, the various concepts presented throughout this disclosure may be implemented in a RAN, or other suitable access network, to provide UEs with access to types of CNs other than GSM networks.

The CN 804 includes a circuit-switched (CS) domain and a packet-switched (PS) domain. Some of the circuit-switched elements are a Mobile services Switching Centre (MSC), a Visitor location register (VLR) and a Gateway MSC. Packet-switched elements include a Serving GPRS Support Node (SGSN) and a Gateway GPRS Support Node (GGSN). Some network elements, like EIR, HLR, VLR and AuC may be shared by both of the circuit-switched and packet-switched domains. In the illustrated example, the CN 804 supports circuit-switched services with a MSC 812 and a GMSC 814. In some applications, the GMSC 814 may be referred to as a media gateway (MGW). One or more RNCs, such as the RNC 806, may be connected to the MSC 812. The MSC 812 is an apparatus that controls call setup, call routing, and UE mobility functions. The MSC 812 also includes a VLR that contains subscriber-related information for the duration that a UE is in the coverage area of the MSC 812. The GMSC 814 provides a gateway through the MSC 812 for the UE to access a circuit-switched network 816. The GMSC 814 includes a home location register (HLR) 815 containing subscriber data, such as the data reflecting the details of the services to which a particular user has subscribed. The HLR is also associated with an authentication center (AuC) that contains subscriber-specific authentication data. When a call is received for a particular UE, the GMSC 814 queries the HLR 815 to determine the UE's location and forwards the call to the particular MSC serving that location.

The CN 804 also supports packet-data services with a serving GPRS support node (SGSN) 818 and a gateway GPRS support node (GGSN) 820. GPRS, which stands for General Packet Radio Service, is designed to provide packet-data services at speeds higher than those available with standard circuit-switched data services. The GGSN 820 provides a connection for the UTRAN 802 to a packet-based network 822. The packet-based network 822 may be the Internet, a private data network, or some other suitable packet-based network. The primary function of the GGSN 820 is to provide the UEs 810 with packet-based network connectivity. Data packets may be transferred between the GGSN 820 and the UEs 810 through the SGSN 818, which performs primarily the same functions in the packet-based domain as the MSC 812 performs in the circuit-switched domain.

An air interface for UMTS may utilize a spread spectrum Direct-Sequence Code Division Multiple Access (DS-CDMA) system. The spread spectrum DS-CDMA spreads user data through multiplication by a sequence of pseudorandom bits called chips. The "wideband" W-CDMA air interface for UMTS is based on such direct sequence spread spectrum technology and additionally calls for a frequency division duplexing (FDD). FDD uses a different carrier frequency for the UL and DL between a Node B 808 and a UE 810. Another air interface for UMTS that utilizes DS-CDMA, and uses time division duplexing (TDD), is the TD-SCDMA air interface. Those skilled in the art will recognize that although various examples described herein may refer to a W-CDMA air interface, the underlying principles may be equally applicable to a TD-SCDMA air interface.

An HSPA air interface includes a series of enhancements to the 3G/W-CDMA air interface, facilitating greater throughput and reduced latency. Among other modifications over prior releases, HSPA utilizes hybrid automatic repeat request (HARQ), shared channel transmission, and adaptive modulation and coding. The standards that define HSPA include HSDPA (high speed downlink packet access) and HSUPA (high speed uplink packet access, also referred to as enhanced uplink, or EUL).

HSDPA utilizes as its transport channel the high-speed downlink shared channel (HS-DSCH). The HS-DSCH is implemented by three physical channels: the high-speed physical downlink shared channel (HS-PDSCH), the high-speed shared control channel (HS-SCCH), and the high-speed dedicated physical control channel (HS-DPCCH).

Among these physical channels, the HS-DPCCH carries the HARQ ACK/NACK signaling on the uplink to indicate whether a corresponding packet transmission was decoded successfully. That is, with respect to the downlink, the UE 810 provides feedback to the node B 808 over the HS-DPCCH to indicate whether it correctly decoded a packet on the downlink.

HS-DPCCH further includes feedback signaling from the UE 810 to assist the node B 808 in taking the right decision in terms of modulation and coding scheme and precoding weight selection, this feedback signaling including the CQI and PCI.

"HSPA Evolved" or HSPA+ is an evolution of the HSPA standard that includes MIMO and 64-QAM, enabling increased throughput and higher performance. That is, in an aspect of the disclosure, the node B 808 and/or the UE 810 may have multiple antennas supporting MIMO technology. The use of MIMO technology enables the node B 808 to exploit the spatial domain to support spatial multiplexing, beamforming, and transmit diversity.

Multiple Input Multiple Output (MIMO) is a term generally used to refer to multi-antenna technology, that is, multiple transmit antennas (multiple inputs to the channel) and multiple receive antennas (multiple outputs from the channel). MIMO systems generally enhance data transmission performance, enabling diversity gains to reduce multipath fading and increase transmission quality, and spatial multiplexing gains to increase data throughput.

Spatial multiplexing may be used to transmit different streams of data simultaneously on the same frequency. The data steams may be transmitted to a single UE 810 to increase the data rate, or to multiple UEs 810 to increase the overall system capacity. This is achieved by spatially precoding each data stream and then transmitting each spatially precoded stream through a different transmit antenna on the downlink. The spatially precoded data streams arrive at the UE(s) 810 with different spatial signatures, which enables each of the UE(s) 810 to recover the one or more the data streams destined for that UE 810. On the uplink, each UE 810 may transmit one or more spatially precoded data streams, which enables the node B 808 to identify the source of each spatially precoded data stream.

Spatial multiplexing may be used when channel conditions are good. When channel conditions are less favorable, beamforming may be used to focus the transmission energy in one or more directions, or to improve transmission based on characteristics of the channel. This may be achieved by spatially precoding a data stream for transmission through multiple antennas. To achieve good coverage at the edges of the cell, a single stream beamforming transmission may be used in combination with transmit diversity.

Generally, for MIMO systems utilizing n transmit antennas, n transport blocks may be transmitted simultaneously over the same carrier utilizing the same channelization code. Note that the different transport blocks sent over the n transmit antennas may have the same or different modulation and coding schemes from one another.

On the other hand, Single Input Multiple Output (SIMO) generally refers to a system utilizing a single transmit antenna (a single input to the channel) and multiple receive antennas (multiple outputs from the channel). Thus, in a SIMO system, a single transport block is sent over the respective carrier.

Figure 9:
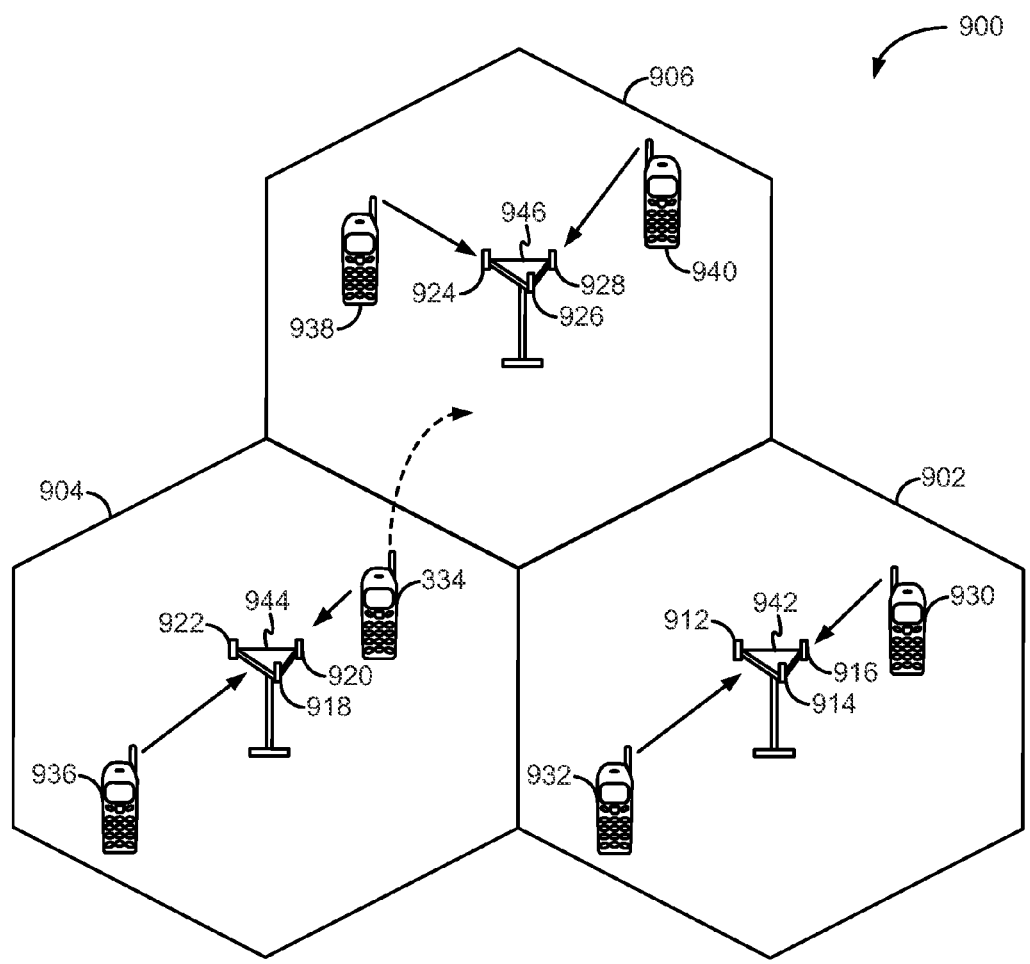
FIG. 9 is a conceptual diagram illustrating an example of an access network for use with a UE configured to perform the functions described herein.

Referring to FIG. 9, an access network 900 in a UTRAN architecture is illustrated. The multiple access wireless communication system includes multiple cellular regions (cells), including cells 902, 904, and 906, each of which may include one or more sectors. The multiple sectors can be formed by groups of antennas with each antenna responsible for communication with UEs in a portion of the cell. For example, in cell 902, antenna groups 912, 914, and 916 may each correspond to a different sector. In cell 904, antenna groups 918, 920, and 922 each correspond to a different sector. In cell 906, antenna groups 924, 926, and 928 each correspond to a different sector. The cells 902, 904 and 906 may include several wireless communication devices, e.g., User Equipment or UEs, which may be in communication with one or more sectors of each cell 902, 904 or 906. For example, UEs 930 and 932 may be in communication with Node B 942, UEs 934 and 936 may be in communication with Node B 944, and UEs 938 and 940 can be in communication with Node B 946. Here, each Node B 942, 944, 946 is configured to provide an access point to a CN 804 (see FIG. 8) for all the UEs 930, 932, 934, 936, 938, 940 in the respective cells 902, 904, and 906. Node Bs 942, 944, 946 and UEs 930, 932, 934, 936, 938, 940 respectively may be configured to include, for example, the call processing component 140/150 (FIG. 2) implementing the components described above, such as, but not limited to Tx/Rx component 142/152, compressor component 144/154, and de-compressor component 146/156, as described above.

As the UE 934 moves from the illustrated location in cell 904 into cell 906, a serving cell change (SCC) or handover may occur in which communication with the UE 934 transitions from the cell 904, which may be referred to as the source cell, to cell 906, which may be referred to as the target cell. Management of the handover procedure may take place at the UE 934, at the Node Bs corresponding to the respective cells, at a radio network controller 806 (see FIG. 8), or at another suitable node in the wireless network. For example, during a call with the source cell 904, or at any other time, the UE 934 may monitor various parameters of the source cell 904 as well as various parameters of neighboring cells such as cells 906 and 902. Further, depending on the quality of these parameters, the UE 934 may maintain communication with one or more of the neighboring cells. During this time, the UE 934 may maintain an Active Set, that is, a list of cells that the UE 934 is simultaneously connected to (i.e., the UTRA cells that are currently assigning a downlink dedicated physical channel DPCH or fractional downlink dedicated physical channel F-DPCH to the UE 934 may constitute the Active Set).

The modulation and multiple access scheme employed by the access network 900 may vary depending on the particular telecommunications standard being deployed. By way of example, the standard may include Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. The standard may alternately be Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), Ultra Mobile Broadband (UMB), and Flash-OFDM employing OFDMA. CDMA2000 and UMB are described in documents from the 3GPP2 organization. The actual wireless communication standard and the multiple access technology employed will depend on the specific application and the overall design constraints imposed on the system.

The radio protocol architecture may take on various forms depending on the particular application. An example for an HSPA system will now be presented with reference to FIG. 10.

Figure 10:
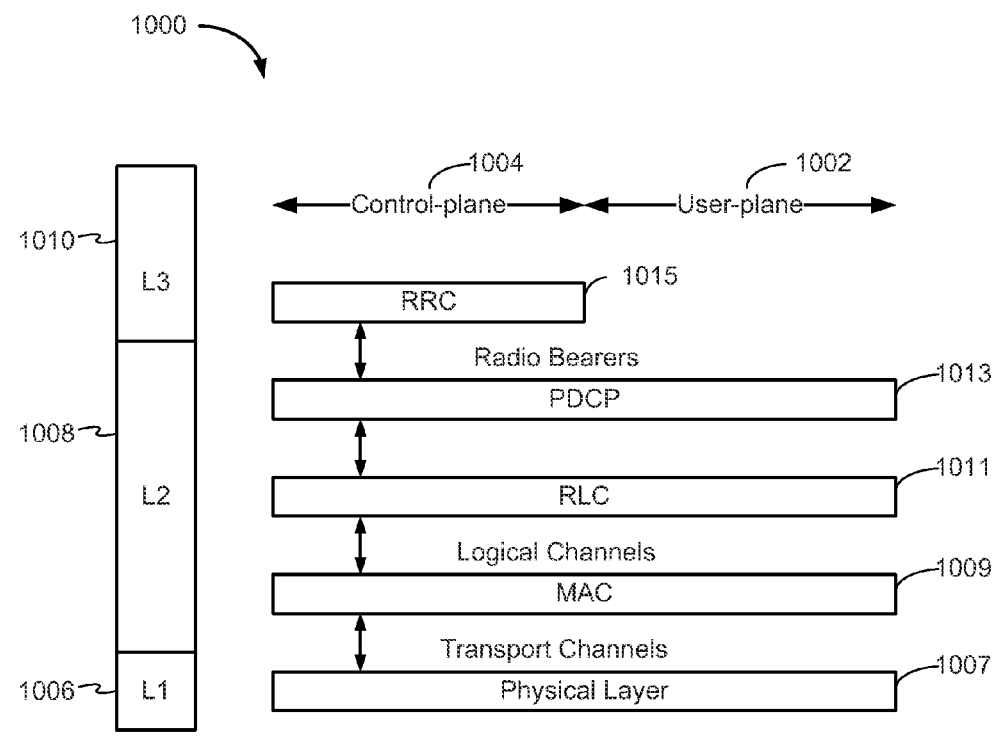
FIG. 10 is a conceptual diagram illustrating an example of a radio protocol architecture for the user and control planes for a base station and/or a UE configured to perform the functions described herein.

FIG. 10 is a conceptual diagram illustrating an example of the radio protocol architecture 1000 for the user plane 1002 and the control plane 1004 of a user equipment (UE) or node B/base station. For example, architecture 1000 may be included in a network entity and/or UE such as an entity within network 112 and/or UE 114 (FIG. 1). The radio protocol architecture 1000 for the UE and node B is shown with three layers: Layer 1 1006, Layer 2 1008, and Layer 3 1010. Layer 1 1006 is the lowest lower and implements various physical layer signal processing functions. As such, Layer 1 1006 includes the physical layer 1007. Layer 2 (L2 layer) 1008 is above the physical layer 1007 and is responsible for the link between the UE and node B over the physical layer 1007. Layer 3 (L3 layer) 1010 includes a radio resource control (RRC) sublayer 1015. The RRC sublayer 1015 handles the control plane signaling of Layer 3 between the UE and the UTRAN.

In the user plane, the L2 layer 1008 includes a media access control (MAC) sublayer 1009, a radio link control (RLC) sublayer 1011, and a packet data convergence protocol (PDCP) 1013 sublayer, which are terminated at the node B on the network side. Although not shown, the UE may have several upper layers above the L2 layer 1008 including a network layer (e.g., IP layer) that is terminated at a PDN gateway on the network side, and an application layer that is terminated at the other end of the connection (e.g., far end UE, server, etc.).

The PDCP sublayer 1013 provides multiplexing between different radio bearers and logical channels. The PDCP sublayer 1013 also provides header compression for upper layer data packets to reduce radio transmission overhead, security by ciphering the data packets, and handover support for UEs between node Bs. The RLC sublayer 1011 provides segmentation and reassembly of upper layer data packets, retransmission of lost data packets, and reordering of data packets to compensate for out-of-order reception due to hybrid automatic repeat request (HARQ). The MAC sublayer 1009 provides multiplexing between logical and transport channels. The MAC sublayer 1009 is also responsible for allocating the various radio resources (e.g., resource blocks) in one cell among the UEs. The MAC sublayer 1009 is also responsible for HARQ operations.

Figure 11:
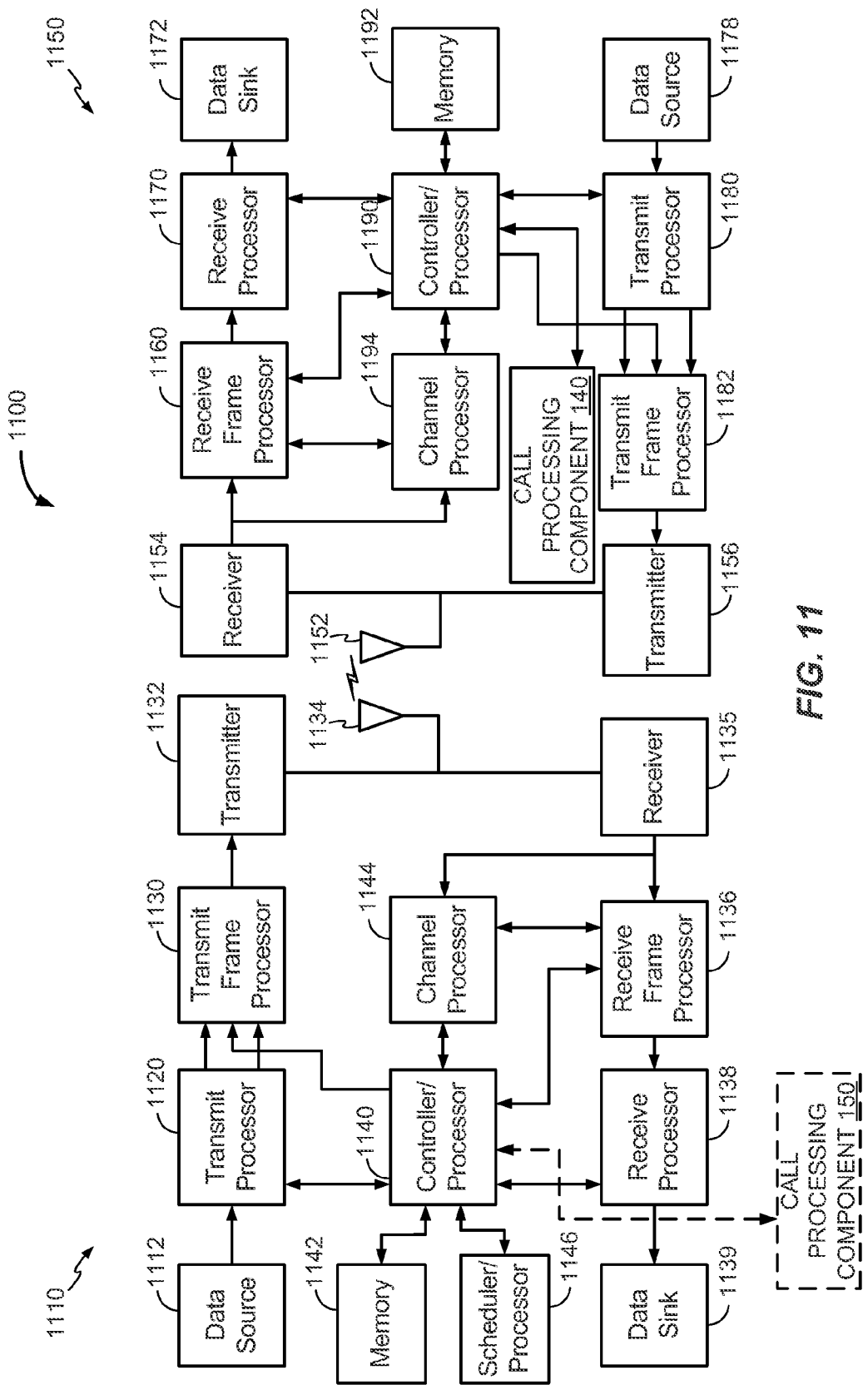
FIG. 11 is a block diagram conceptually illustrating an example of a Node B in communication with a UE in a telecommunications system configured to perform the functions described herein.

FIG. 11 is a block diagram of a communication system 1100 including a Node B 1110 in communication with a UE 1150, where Node B 1110 may be an entity within network 112 and the UE 1150 may be UE 114 according to the aspect described in FIG. 1. UE 1150 and Node B 1110 may be configured to include, for example, the call processing component 140/150 (FIG. 2) implementing the components described above, such as, but not limited to Tx/Rx component 142/152, compressor component 144/154, and de-compressor component 146/156, as described above. In the downlink communication, a transmit processor 1120 may receive data from a data source 1112 and control signals from a controller/processor 1140. The transmit processor 1120 provides various signal processing functions for the data and control signals, as well as reference signals (e.g., pilot signals). For example, the transmit processor 1120 may provide cyclic redundancy check (CRC) codes for error detection, coding and interleaving to facilitate forward error correction (FEC), mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM), and the like), spreading with orthogonal variable spreading factors (OVSF), and multiplying with scrambling codes to produce a series of symbols. Channel estimates from a channel processor 1144 may be used by a controller/processor 1140 to determine the coding, modulation, spreading, and/or scrambling schemes for the transmit processor 1120. These channel estimates may be derived from a reference signal transmitted by the UE 1150 or from feedback from the UE 1150. The symbols generated by the transmit processor 1120 are provided to a transmit frame processor 1130 to create a frame structure. The transmit frame processor 1130 creates this frame structure by multiplexing the symbols with information from the controller/processor 1140, resulting in a series of frames. The frames are then provided to a transmitter 1132, which provides various signal conditioning functions including amplifying, filtering, and modulating the frames onto a carrier for downlink transmission over the wireless medium through antenna 1134. The antenna 1134 may include one or more antennas, for example, including beam steering bidirectional adaptive antenna arrays or other similar beam technologies.

At the UE 1150, a receiver 1154 receives the downlink transmission through an antenna 1152 and processes the transmission to recover the information modulated onto the carrier. The information recovered by the receiver 1154 is provided to a receive frame processor 1160, which parses each frame, and provides information from the frames to a channel processor 1194 and the data, control, and reference signals to a receive processor 1170. The receive processor 1170 then performs the inverse of the processing performed by the transmit processor 1120 in the Node B 1110. More specifically, the receive processor 1170 descrambles and despreads the symbols, and then determines the most likely signal constellation points transmitted by the Node B 1110 based on the modulation scheme. These soft decisions may be based on channel estimates computed by the channel processor 1194. The soft decisions are then decoded and deinterleaved to recover the data, control, and reference signals. The CRC codes are then checked to determine whether the frames were successfully decoded. The data carried by the successfully decoded frames will then be provided to a data sink 1172, which represents applications running in the UE 1150 and/or various user interfaces (e.g., display). Control signals carried by successfully decoded frames will be provided to a controller/processor 1190. When frames are unsuccessfully decoded by the receiver processor 1170, the controller/processor 1190 may also use an acknowledgement (ACK) and/or negative acknowledgement (NACK) protocol to support retransmission requests for those frames.

In the uplink, data from a data source 1178 and control signals from the controller/processor 1190 are provided to a transmit processor 1180. The data source 1178 may represent applications running in the UE 1150 and various user interfaces (e.g., keyboard). Similar to the functionality described in connection with the downlink transmission by the Node B 1110, the transmit processor 1180 provides various signal processing functions including CRC codes, coding and interleaving to facilitate FEC, mapping to signal constellations, spreading with OVSFs, and scrambling to produce a series of symbols. Channel estimates, derived by the channel processor 1194 from a reference signal transmitted by the Node B 1110 or from feedback contained in the midamble transmitted by the Node B 1110, may be used to select the appropriate coding, modulation, spreading, and/or scrambling schemes. The symbols produced by the transmit processor 1180 will be provided to a transmit frame processor 1182 to create a frame structure. The transmit frame processor 1182 creates this frame structure by multiplexing the symbols with information from the controller/processor 1190, resulting in a series of frames. The frames are then provided to a transmitter 1156, which provides various signal conditioning functions including amplification, filtering, and modulating the frames onto a carrier for uplink transmission over the wireless medium through the antenna 1152.

The uplink transmission is processed at the Node B 1110 in a manner similar to that described in connection with the receiver function at the UE 1150. A receiver 1135 receives the uplink transmission through the antenna 1134 and processes the transmission to recover the information modulated onto the carrier. The information recovered by the receiver 1135 is provided to a receive frame processor 1136, which parses each frame, and provides information from the frames to the channel processor 1144 and the data, control, and reference signals to a receive processor 1138. The receive processor 1138 performs the inverse of the processing performed by the transmit processor 1180 in the UE 1150. The data and control signals carried by the successfully decoded frames may then be provided to a data sink 1139 and the controller/processor, respectively. If some of the frames were unsuccessfully decoded by the receive processor, the controller/processor 1140 may also use an acknowledgement (ACK) and/or negative acknowledgement (NACK) protocol to support retransmission requests for those frames.

The controller/processors 1140 and 1190 may be used to direct the operation at the Node B 1110 and the UE 1150, respectively. For example, the controller/processors 1140 and 1190 may provide various functions including timing, peripheral interfaces, voltage regulation, power management, and other control functions. The computer readable media of memories 1142 and 1192 may store data and software for the Node B 1110 and the UE 1150, respectively. A scheduler/processor 1146 at the Node B 1110 may be used to allocate resources to the UEs and schedule downlink and/or uplink transmissions for the UEs.

Several aspects of a telecommunications system have been presented with reference to a W-CDMA system. As those skilled in the art will readily appreciate, various aspects described throughout this disclosure may be extended to other telecommunication systems, network architectures and communication standards.

By way of example, various aspects may be extended to other UMTS systems such as TD-SCDMA, High Speed Downlink Packet Access (HSDPA), High Speed Uplink Packet Access (HSUPA), High Speed Packet Access Plus (HSPA+) and TD-CDMA. Various aspects may also be extended to systems employing Long Term Evolution (LTE) (in FDD, TDD, or both modes), LTE-Advanced (LTE-A) (in FDD, TDD, or both modes), CDMA2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

In accordance with various aspects of the disclosure, an element, or any portion of an element, or any combination of elements may be implemented with a "processing system" or processor (FIG. 5 or 12) that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may be resident in the processing system, external to the processing system, or distributed across multiple entities including the processing system. The computer-readable medium may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a: b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method of formatting compressed data packets for wireless communication between a user equipment (UE) and a serving node, comprising:
    identifying a first data string within a data packet that was previously stored at a first memory location in a compressor memory;
    identifying a second data string within the data packet that does not have a match in the compressor memory;
    generating a first pointer that references the first memory location in the compressor memory; and
    creating a compressed data packet by replacing the first data string with the first pointer, and including an indicator corresponding to a number of pointers in the data packet, wherein the creating includes:
        including the first pointer after the indicator located at the beginning of the compressed data packet; and
        including a copy of the second data string after the first pointer in the compressed data packet.

2. The method of claim 1, wherein the indicator is located at a beginning of the compressed data packet, and wherein the indicator identifies that the first pointer is a data reference.

3. The method of claim 1, wherein the indicator identifies that the first pointer is a data reference and that the second data string is literal data.

4. The method of claim 1, wherein the first pointer further comprises:
   a position set of bits corresponding to a position of the first data string when the compressed data packet is decompressed;
   a location set of bits corresponding to the first memory location in the compressor memory where the first data string was previously stored; and
   a length set of bits corresponding to a number of bytes to be retrieved from the first memory location in the compressor memory.

5. The method of claim 4, wherein the position set of bits is positioned after the indicator located at the beginning of the compressed data packet and adjacent to the location set of bits, and wherein the location set of bits is positioned prior to and adjacent to the length set of bits.

6. The method of claim 1, further comprising:
   identifying additional data strings within the data packet that were previously stored at additional memory locations in the compressor memory;
   generating an additional pointer for each of the additional data strings that references a corresponding additional memory location in the compressor memory;
   replacing the additional data strings with the additional pointers in the compressed data packet; and
   updating the indicator to account for the additional pointers.

7. An apparatus for formatting compressed data packets for wireless communication between a user equipment (UE) and a serving node, comprising:
   means for identifying a first data string within a data packet that was previously stored at a first memory location in a compressor memory;
   means for identifying a second data string within the data packet that does not have a match in the compressor memory;
   means for generating a first pointer that references the first memory location in the compressor memory; and
   means for creating a compressed data packet by replacing the first data string with the first pointer, and including an indicator corresponding to a number of pointers in the data packet, wherein the means for creating includes:
      means for including the first pointer after the indicator located at the beginning of the compressed data packet; and
      means for including a copy of the second data string after the first pointer in the compressed data packet.

8. An apparatus for formatting compressed data packets for wireless communication between a user equipment (UE) and a serving node, comprising:
   a compressor component configured to identify a first data string within a data packet that was previously stored at a first memory location in a compressor memory;
   wherein the compressor component is further configured to identify a second data string within the data packet that does not have a match in the compressor memory;
   a formatting component configured to generate a first pointer that references the first memory location in the compressor memory; and
   wherein the compressor component is further configured to create a compressed data packet by replacing the first data string with the first pointer, and including an indicator corresponding to a number of pointers in the data packet, wherein the compressor component is further configured to:
      include the first pointer after the indicator located at the beginning of the compressed data packet; and
      include a copy of the second data string after the first pointer in the compressed data packet.

9. The apparatus of claim 8, wherein the indicator is located at a beginning of the compressed data packet, and wherein the indicator identifies that the first pointer is a data reference.

10. The apparatus of claim 8, wherein the indicator identifies that the first pointer is a data reference and that the second data string is literal data.

11. The apparatus of claim 8, wherein the first pointer further comprises:
   a position set of bits corresponding to a position of the first data string when the compressed data packet is decompressed;
   a location set of bits corresponding to the first memory location in the compressor memory where the first data string was previously stored; and
   a length set of bits corresponding to a number of bytes to be retrieved from the first memory location in the compressor memory.

12. The apparatus of claim 11, wherein the position set of bits is positioned after the indicator located at the beginning of the compressed data packet and adjacent to the location set of bits, and wherein the location set of bits is positioned prior to and adjacent to the length set of bits.

13. The apparatus of claim 8, wherein the compressor component is further configured to:
   identify additional data strings within the data packet that were previously stored at additional memory locations in the compressor memory;
   generate an additional pointer for each of the additional data strings that references a corresponding additional memory location in the compressor memory;
   replace the additional data strings with the additional pointers in the compressed data packet; and
   update the indicator to account for the additional pointers.

14. A non-transitory computer-readable medium storing computer executable code for formatting compressed data packets for wireless communication between a user equipment (UE) and a serving node, comprising:
   code for identifying a first data string within a data packet that was previously stored at a first memory location in a compressor memory;
   code for identifying a second data string within the data packet that does not have a match in the compressor memory;
   code for generating a first pointer that references the first memory location in the compressor memory; and
   code for creating a compressed data packet by replacing the first data string with the first pointer, and including an indicator corresponding to a number of pointers in the data packet, wherein the code for creating includes:
      code for including the first pointer after the indicator located at the beginning of the compressed data packet; and
      code for including a copy of the second data string after the first pointer in the compressed data packet.

* * * * *